US012618870B2

(12) United States Patent
Ahn et al.

(10) Patent No.: US 12,618,870 B2
(45) Date of Patent: May 5, 2026

(54) VERTICAL PROBE CARD

(71) Applicant: POINT ENGINEERING CO., LTD.,
Chungcheongnam-do (KR)

(72) Inventors: Bum Mo Ahn, Gyeonggi-do (KR);
Seung Ho Park, Gyeonggi-do (KR);
Sung Hyun Byun, Gyeonggi-do (KR)

(73) Assignee: POINT ENGINEERING CO., LTD.,
Chungcheongnam-do (KR)

( * ) Notice: Subject to any disclaimer, the term of this
patent is extended or adjusted under 35
U.S.C. 154(b) by 81 days.

(21) Appl. No.: 18/684,829

(22) PCT Filed: Jul. 29, 2022

(86) PCT No.: PCT/KR2022/011156
§ 371 (c)(1),
(2) Date: Feb. 19, 2024

(87) PCT Pub. No.: WO2023/033372
PCT Pub. Date: Mar. 9, 2023

(65) Prior Publication Data
US 2024/0426871 A1 Dec. 26, 2024

(30) Foreign Application Priority Data

Aug. 30, 2021 (KR) ........................ 10-2021-0114423

(51) Int. Cl.
G01R 1/067 (2006.01)
G01R 1/073 (2006.01)
(52) U.S. Cl.
CPC ..... G01R 1/06716 (2013.01); G01R 1/07314
(2013.01)

(58) Field of Classification Search
CPC ........... G01R 1/06716; G01R 1/07314; G01R
1/06722; G01R 1/07378
USPC .......................... 324/755.05, 755.06, 756.04
See application file for complete search history.

(56) References Cited

U.S. PATENT DOCUMENTS

| | | | | |
|---|---|---|---|---|
| 11,802,891 B1* | 10/2023 | Wu | .......................... | G01R 3/00 |
| 2008/0204061 A1* | 8/2008 | Chartarifsky | ...... | G01R 1/07342 |
| | | | | 324/755.05 |
| 2008/0238408 A1* | 10/2008 | McQuade | .......... | G01R 1/06738 |
| | | | | 324/149 |
| 2009/0219043 A1* | 9/2009 | Nakayama | ......... | G01R 31/2889 |
| | | | | 324/762.05 |
| 2010/0244875 A1* | 9/2010 | Chabineau-Lovgren | .................... | |
| | | | | H01R 12/714 |
| | | | | 324/755.11 |

(Continued)

FOREIGN PATENT DOCUMENTS

| | | |
|---|---|---|
| JP | 2012145593 | 8/2012 |
| JP | 2013205098 | 10/2013 |

(Continued)

OTHER PUBLICATIONS

"International Search Report (Form PCT/ISA/210) of PCT/KR2022/
011156", mailed on Nov. 7, 2022, pp. 1-3.

(Continued)

*Primary Examiner* — Roberto Velez
(74) *Attorney, Agent, or Firm* — JCIPRNET

(57) ABSTRACT
Proposed is a vertical probe card capable of effectively
testing the electrical characteristics of a test object without
a body thereof being elastically bent or curved in a convex
shape in the horizontal direction by pressure applied to
opposite ends thereof.

11 Claims, 20 Drawing Sheets

10

(56)     References Cited

U.S. PATENT DOCUMENTS

| | | | |
|---|---|---|---|
| 2014/0065893 A1* | 3/2014 | Vinther | H01R 4/48 |
| | | | 439/817 |
| 2017/0115324 A1* | 4/2017 | Teranishi | G01R 1/0483 |
| 2018/0003765 A1* | 1/2018 | Kim | G01R 31/2889 |
| 2021/0239735 A1 | 8/2021 | Ahn et al. | |

FOREIGN PATENT DOCUMENTS

| | | |
|---|---|---|
| JP | 2018197714 | 12/2018 |
| JP | 2019082378 | 5/2019 |
| KR | 100806380 | 2/2008 |
| KR | 101662951 | 10/2016 |
| KR | 20160149005 | 12/2016 |
| KR | 20170090586 | 8/2017 |
| KR | 101799309 | 12/2017 |
| KR | 20180126387 | 11/2018 |
| KR | 101913355 | 12/2018 |
| KR | 102232788 | 3/2021 |
| KR | 20210098090 | 8/2021 |
| KR | 20220142627 | 10/2022 |

OTHER PUBLICATIONS

"Office Action of Korea Counterpart Application", issued on May 26, 2025, with English translation thereof, p. 1-p. 17.

"Notification of Review Opinions of Taiwan Counterpart Application, Application No. 111130678", issued on Dec. 15, 2025, with English translation thereof, p. 1-p. 20.

"Written Decision on Registration of Korea Counterpart Application, Application No. 10-2021-0114423", issued on Feb. 9, 2026, with English translation thereof, p. 1-p. 6.

* cited by examiner

100

100

110

144a

110a

145a

141(140)

145(140)

149a

131

144b

110b

145b

130b

130a 180
160 y
z      x

M

A                                           A'

88 z y

VERTICAL PROBE CARD

CROSS-REFERENCE TO RELATED APPLICATION

This application is a 371 of international application of PCT application serial no. PCT/KR2022/011156, filed on Jul. 29, 2022, which claims the priority benefit of Korea application no. 10-2021-0114423, filed on Aug. 30, 2021. The entirety of each of the above-mentioned patent applications is hereby incorporated by reference herein and made a part of this specification.

TECHNICAL FIELD

The present disclosure relates to a vertical probe card.

BACKGROUND ART

FIG. 1 is a view schematically illustrating a vertical probe card 1 according to the related art, and FIGS. 2 and 3 are enlarged views illustrating a probe head 4 illustrated in FIG. 1.

The testing of semiconductor chips at the wafer-level is performed by a probe card. The probe card is mounted between a wafer and a head of test equipment. About 8,000 to 100,000 probe pins on the probe card are brought into contact with pads in individual chips on the wafer to play the role of an intermediate medium that allows test signals to be exchanged between probe equipment and the individual chips. The types of the probe card may be classified into a vertical probe card, a cantilever probe card, and a micro-electro-mechanical system (MEMS) probe card. The present disclosure relates to the vertical probe card among these probe cards.

The vertical probe card 1 generally includes a circuit board 2, a space transformer 3 provided under the circuit board 2, and a probe head 4 provided under the space transformer 3.

The probe head 4 includes a plurality of probe pins 7 and guide plates 5 and 6 having guide holes into which the probe pins 7 are inserted. The probe head 4 includes an upper guide plate 5 and a lower guide plate 6. The upper guide plate 5 and the lower guide plate 6 are fixedly installed through a spacer. The probe pins 7 have a structure elastically deformable between the upper guide plate 5 and the lower guide plate 6, and these probe pins 7 are adopted to constitute the vertical probe card 1.

Referring to FIGS. 2 and 3, a test for electrical characteristics of a semiconductor device is performed by approaching a wafer W to the probe card 1 having the plurality of probe pins 7 and then bringing the respective probe pins 7 into contact with corresponding electrode pads WP on the wafer W. After the probe pins 7 reach positions where the probe pins 7 are brought into contact with the electrode pads WP, an overdrive process is performed to further lift the wafer W by a predetermined height toward the probe card 1. The overdrive process is inevitable because there is a difference in length between the plurality of probe pins 7 due to errors in a manufacturing process, and there is a slight difference in flatness between the guide plates 5 and 6 and the space transformer 3, and there is a difference in height between the electrode pads WP.

During the overdrive process, an oxide layer 8 formed on each electrode pad WP is removed and each probe pin 7 and a conductive material layer of the electrode pad WP are electrically connected to each other, whereby the electrical characteristics of the semiconductor device are tested.

In order to ensure good electrical and mechanical contact for all the probe pins 7, an overdrive with sufficient upward stroke is required. Consequently, a greater pressing force than a certain level is required to provide a sufficient overdrive for the plurality of probe pins 7. However, this high pressing force causes the probe pins 7 to apply excessive pressure to inner walls of the guide holes of the guide plates 5 and 6. Such excessive pressure results in abrasion of the inner walls of the guide holes, generating foreign substances. These foreign substances fall to the electrode pads WP, thereby making it difficult to test electrical characteristics. In addition, since the overdrive process is repeated with excessive pressure, fatigue failure of the probe pins 7 occurs in a short period of time.

Meanwhile, referring to FIG. 4, the oxide layer 8 removed by the probe pin 7 generates shavings. When the probe pin 7 is buckled, i.e., bent or curved, by the pressure applied to opposite ends of the probe pin 7, the contact point of the probe pin 7 removes the oxide layer 8 under a high contact pressure, and this excessive contact pressure results in formation of a large concave on the surface of the electrode pad WP. Such a large concave causes a poor connection in a bonding process of the semiconductor device, and excessively generated shavings adhere to the ends of the probe pin 7, thereby increasing contact resistance.

Meanwhile, the probe pins 7 used in the related-art vertical probe card 1 are inserted into the upper and lower guide plates 5 and 6 and are buckled in one direction by the pressure applied to the opposite ends thereof while being supported by the guide plates 5 and 6. With the recent trend in semiconductor devices toward the integration of multiple functions in one device and faster processing speed, the number of input/output terminals has been increased and the pitch between electrode pads of the semiconductor device has been decreased. In order to cope with the trend toward a narrower pitch, the probe pins 7 have to also be arranged at a narrower pitch. However, when the probe pins 7 arranged at a narrower pitch are buckled, a problem occurs in that adjacent probe pins 7 are brought into contact with each other and thus are short-circuited. In addition, in order to arrange the probe pins 7 at a narrower pitch, the guide holes have to also be arranged at a narrower pitch. As a result, the clearance width between adjacent guide holes is reduced, making it more difficult to process the guide holes. This also reduces the rigidity of the guide plates 5 and 6. In particular, since the probe pins 7 continuously apply pressure to the guide plates 5 and 6 as they are buckled, the fatigue failure rate of the guide plates 5 and 6 is increased.

Until now, as the probe pins 7 used in the vertical probe card 1, there has been used only (i) a structure pre-deformed at the time of manufacture (this type of probe pin 7 is called a "cobra pin" in the field) or (ii) a structure in which a probe pin 7 is straight at the time of manufacture and then is deformed by moving a guide plate in a horizontal direction (this type of probe pin 7 is called a "straight pin" in the field).

However, the above series of problems are caused by the use of the cobra pin or the straight pin for the vertical probe card 1. In other words, the above problems occur because of the structure in which a body of each probe pin 7 is elastically bent or curved in a convex shape in the horizontal direction by the pressure applied to the opposite ends thereof.

DOCUMENTS OF RELATED ART (Patent Document 1) Korean Patent No. 10-1913355

DISCLOSURE OF INVENTION

Technical Problem

Accordingly, the present disclosure has been made keeping in mind the above problems occurring in the related art, and an objective of the present disclosure is to provide a vertical probe card capable of effectively testing the electrical characteristics of a test object without a body thereof being elastically bent or curved in a convex shape in the horizontal direction by pressure applied to opposite ends thereof.

Solution to Problem

In order to achieve the above objective, according to one aspect of the present disclosure, there is provided a vertical probe card that is used in a test process of testing a chip manufactured on a wafer during a semiconductor manufacturing process and is capable of coping with a narrower pitch, the vertical probe card including: a space transformer having a connection pad; a guide plate provided under the space transformer so as to be spaced apart from the space transformer; and a probe pin inserted and installed into a hole of the guide plate, wherein the probe pin may include: a first plunger located at an upper portion thereof and configured to be connected to the connection pad of the space transformer; a second plunger located at a lower portion thereof and configured to be connected to the chip; and an elastic portion configured to elastically displace the first plunger and the second plunger in a length direction of the probe pin, wherein the elastic portion may have a uniform cross-sectional shape in a thickness direction of the probe pin, and the elastic portion may have a uniform thickness in a width direction and the length direction of the probe pin.

Furthermore, a support portion configured to guide the elastic portion to be compressed and extended in the length direction of the probe pin and configured to prevent the elastic portion from being buckled when compressed may be provided outside the elastic portion along the length direction of the probe pin.

Furthermore, the second plunger moves vertically upward inside the support portion and performs a wiping operation at a second contact point.

Furthermore, during an overdrive process in which the probe pin tests the chip, the support portion may maintain a vertical state, and the second plunger may perform a wiping operation on the chip as the second plunger is tilted while maintaining a contact pressure with the chip.

Furthermore, as the first plunger is vertically moved downward inside the support portion, an additional contact point may be formed between the first plunger and the support portion.

Furthermore, the vertical probe card may test a non-memory semiconductor chip.

Furthermore, a pitch between adjacent probe pins may be in a range of 50 μm to 160 μm.

Furthermore, the elastic portion may include: a first elastic portion connected to the first plunger; a second elastic portion connected to the second plunger; and an intermediate fixing portion provided between the first elastic portion and the second elastic portion and provided integrally with the support portion.

Furthermore, before the probe pin tests the chip, the first plunger may be in a state in contact with the connection pad so that the first elastic portion is compressively deformed in the length direction of the probe pin, and the second plunger may be in a state not in contact with the chip, and when the probe pin tests the chip, the second plunger may be brought into contact with the chip so that the second elastic portion is compressively deformed.

Furthermore, a lateral width of the probe pin may be in a range of 40 μm to 200 μm, and a thickness of the probe pin may be in a range of 40 μm to 200 μm.

Furthermore, the elastic portion may be formed by repeatedly bending a plate, and an actual width of the plate and a thickness of the plate may have a ratio in a range of 1:5 to 1:30.

Furthermore, a plurality of fine trenches may be formed in a side surface of the probe pin in a corrugated shape in which peaks and valleys with a depth in a range of 20 nm to 1 μm are repeated along the side surface of the probe pin in a direction orthogonal to the thickness direction of the probe pin.

Advantageous Effects of Invention

The present disclosure can provide a vertical probe card capable of effectively testing the electrical characteristics of a test object without a body thereof being elastically bent or curved in a convex shape in the horizontal direction by pressure applied to opposite ends thereof.

5

FIGS. 9*a* to 9*d* are views illustrating a method of manufacturing the probe pin of the vertical probe card according to the exemplary embodiment of the present disclosure.

Figure 10:
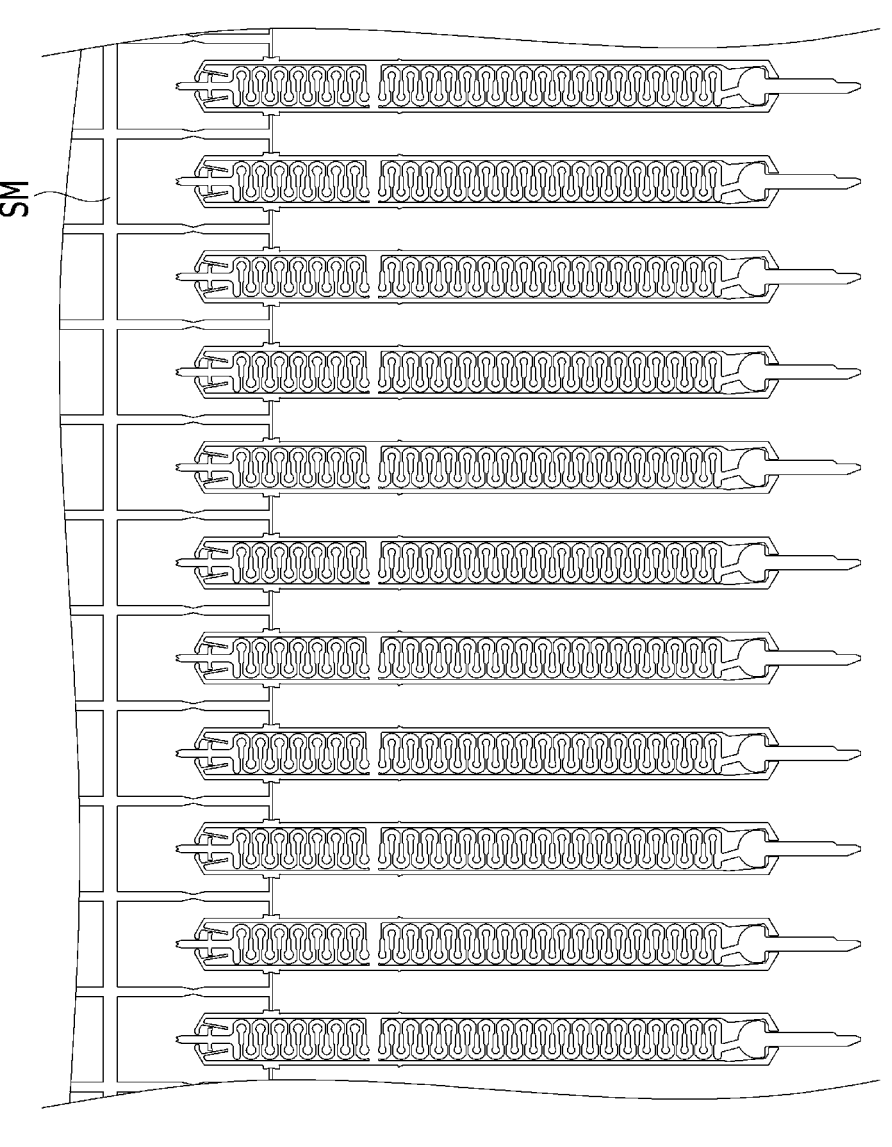

FIG. 10 is a view illustrating a state in which the plurality of probe pins of the vertical probe card according to the exemplary embodiment of the present disclosure are supported by a support mold.

Figure 11:
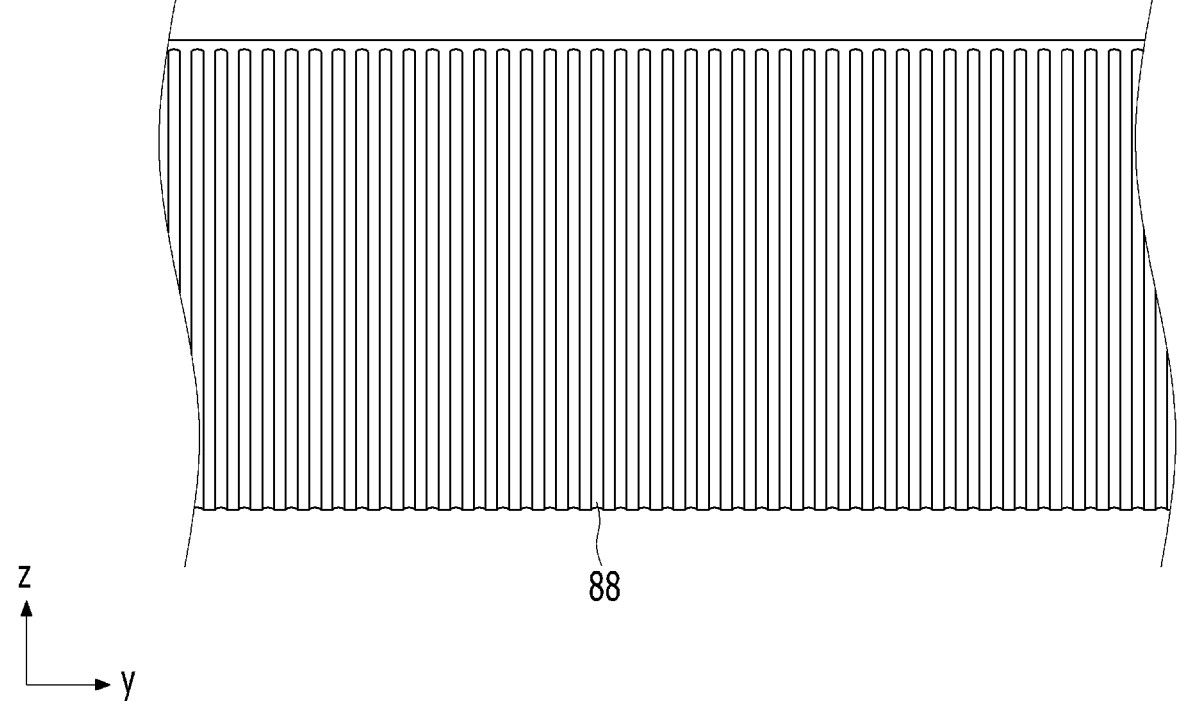

FIG. 11 is a view illustrating a side surface of the probe pin of the vertical probe card according to the exemplary embodiment of the present disclosure.

Figure 12:
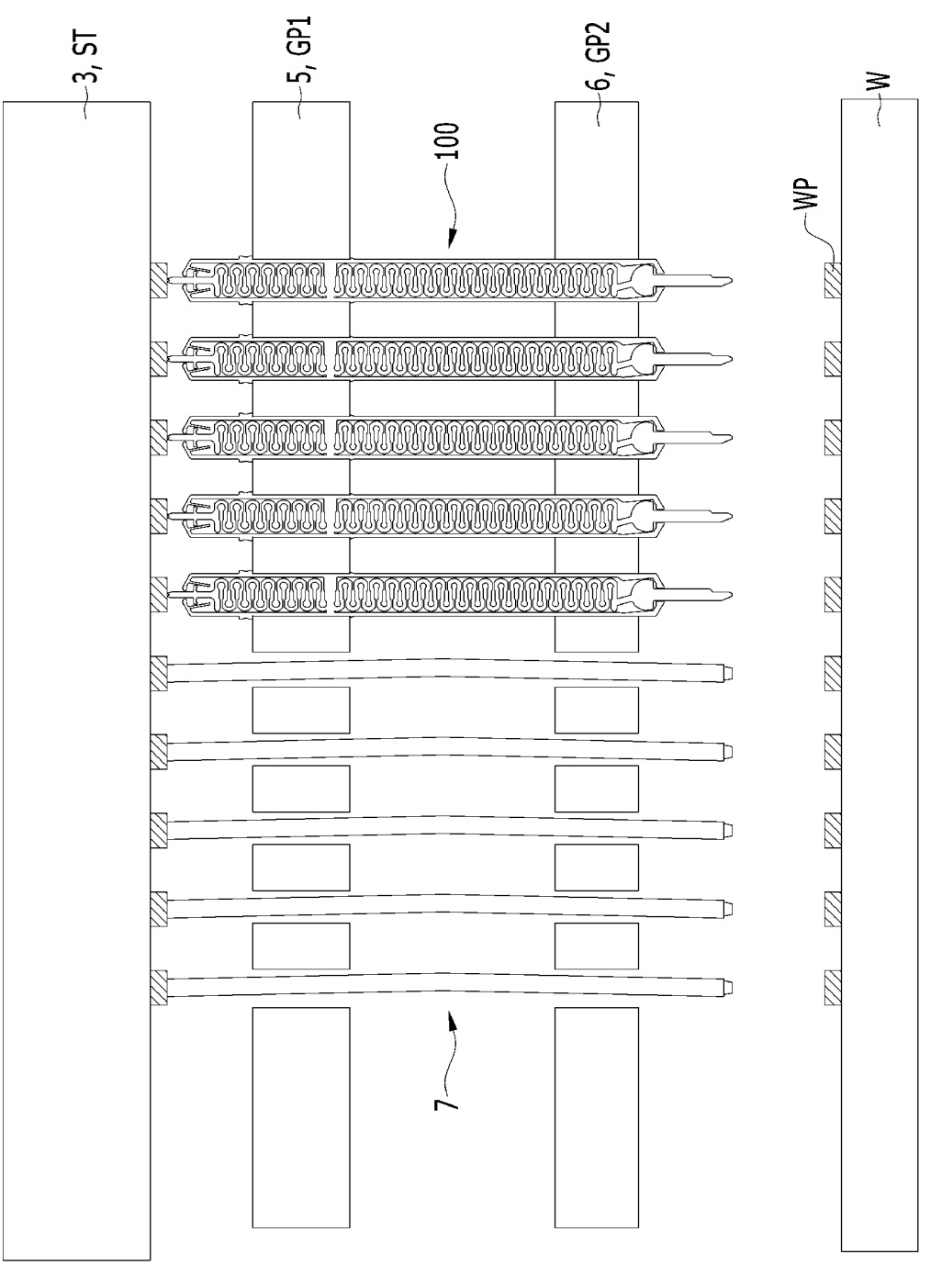
Figure 13:
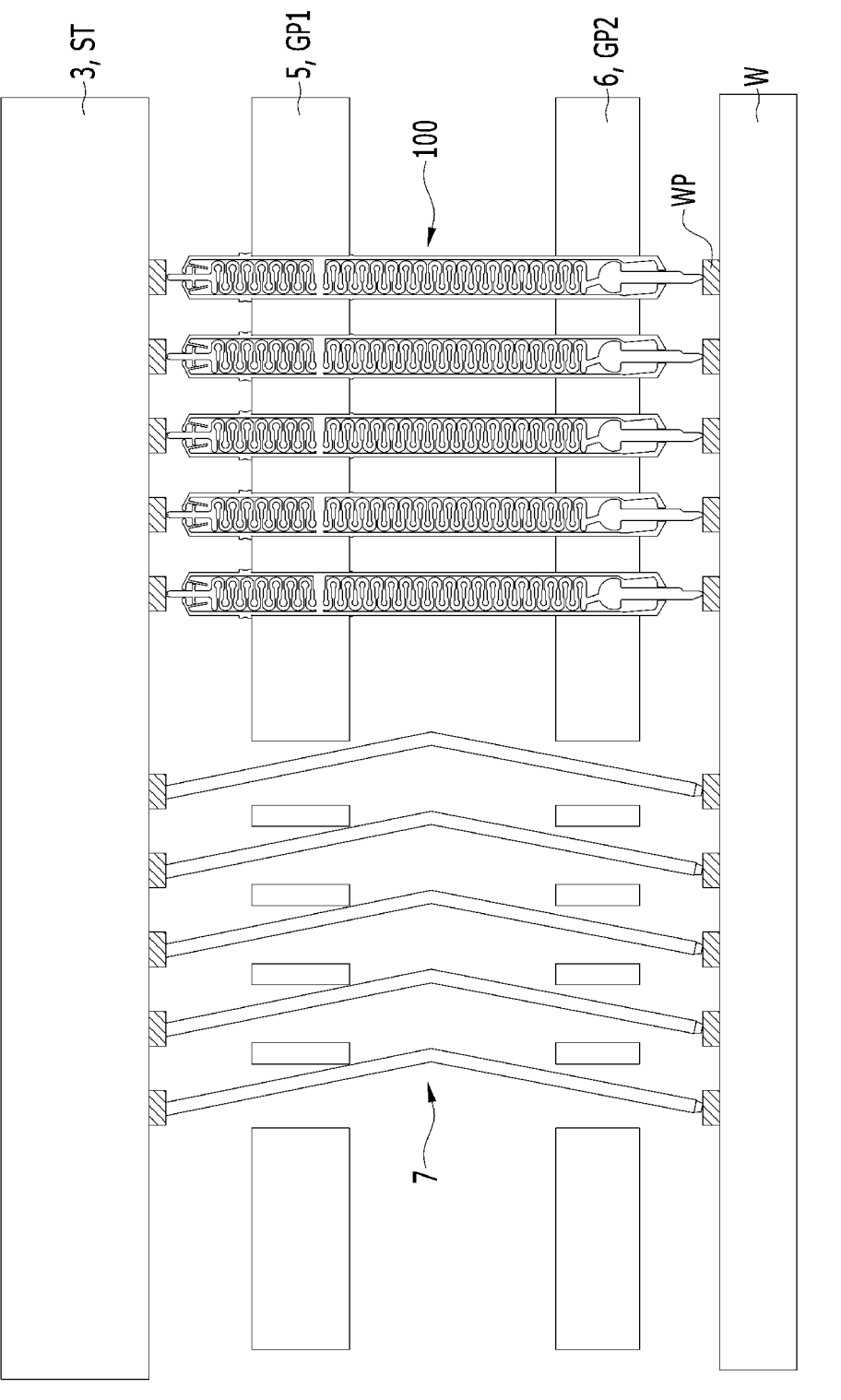

FIGS. 12 and 13 are views illustrating a comparison between the vertical probe card according to the exemplary embodiment of the present disclosure and the vertical probe card according to the related art.

MODE FOR THE INVENTION

Contents of the description below merely exemplify the principle of the disclosure. Therefore, those of ordinary skill in the art may implement the theory of the disclosure and invent various apparatuses which are included within the concept and the scope of the disclosure even though it is not clearly explained or illustrated in the description. Furthermore, in principle, all the conditional terms and embodiments listed in this description are clearly intended for the purpose of understanding the concept of the disclosure, and one should understand that this disclosure is not limited the exemplary embodiments and the conditions.

The above-described objectives, features, and advantages will be more apparent through the following detailed description related to the accompanying drawings, and thus those of ordinary skill in the art may easily implement the technical spirit of the disclosure.

The embodiments of the present disclosure will be described with reference to cross-sectional views and/or perspective views which schematically illustrate ideal embodiments of the present disclosure. For explicit and convenient description of the technical content, sizes or thicknesses of films and regions in the figures may be exaggerated. Therefore, variations from the shapes of the illustrations as a result, for example, of manufacturing techniques and/or tolerances, are to be expected. Thus, the embodiments should not be construed as limited to the particular shapes of regions illustrated herein but are to include deviations in shapes that result, for example, from manufacturing. The technical terms used herein are for the purpose of describing particular embodiments only and should not be construed as limiting the present disclosure. As used herein, the singular forms are intended to include the plural forms as well, unless the context clearly indicates otherwise. It will be further understood that the terms "comprise", "include", "have", etc. when used herein, specify the presence of stated features, integers, steps, operations, elements, components, and/or combinations thereof but do not preclude the presence or addition of one or more other features, integers, steps, operations, elements, components, and/or combinations thereof.

Hereinafter, a vertical probe card according to an exemplary embodiment of the present disclosure will be described with reference to the drawings.

In the following description, the width direction of a probe pin refers to the ±x direction indicated in the drawings, the length direction of the probe pin refers to the ±y direction indicated in the drawings, and the thickness direction of the probe pin refers to the ±z direction indicated in the drawings. The probe pin has an overall length L in the length direction (±y direction), an overall thickness H in the thickness direction (±z direction) orthogonal to the length direction, and an overall width W in the width direction (±x direction) orthogonal to the length direction.

Figure 1:
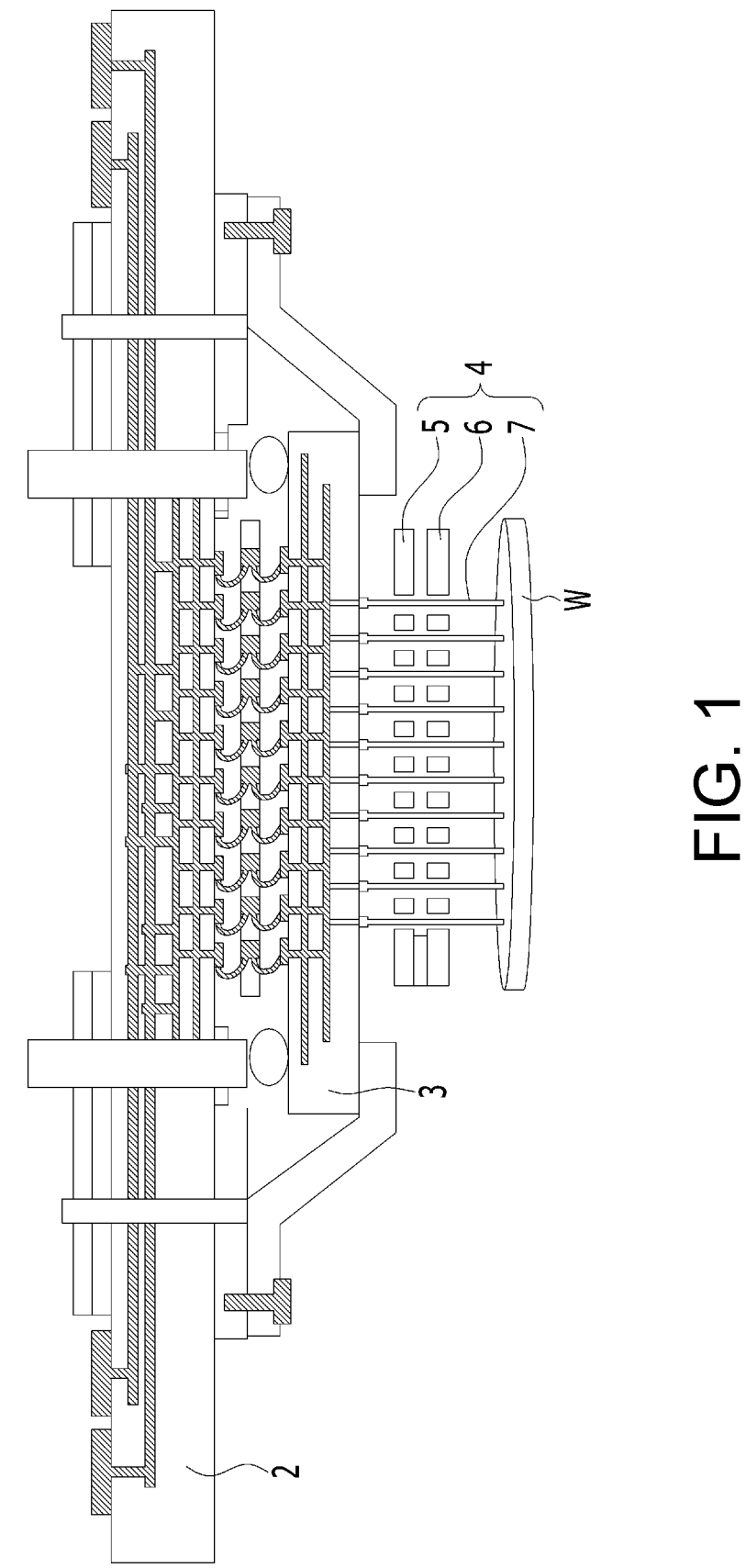
FIG. 1 is a view schematically illustrating a vertical probe card according to the related art.
Figure 2:
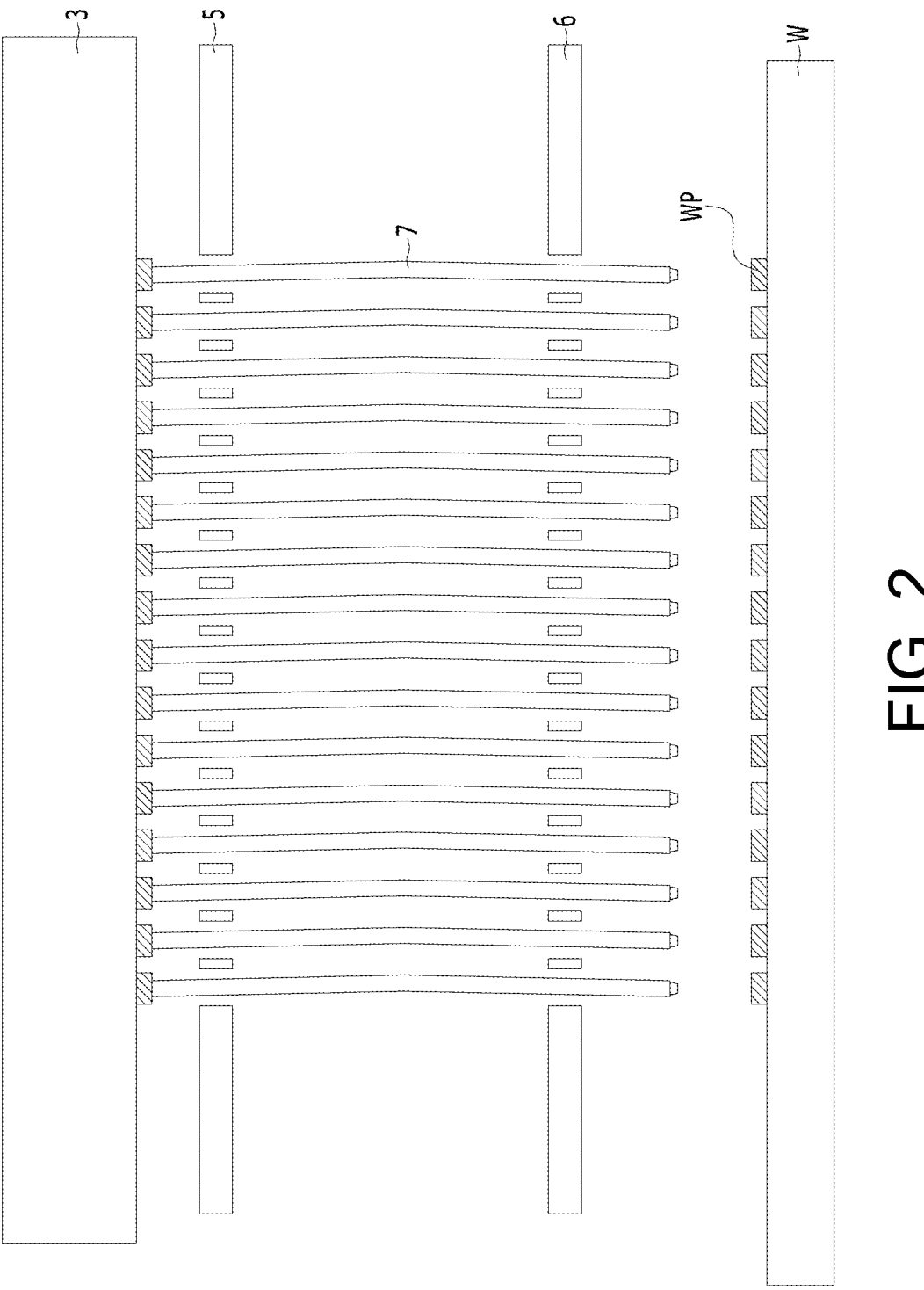
FIGS. 2 and 3 are enlarged views illustrating a probe head illustrated in FIG. 1.
Figure 3:
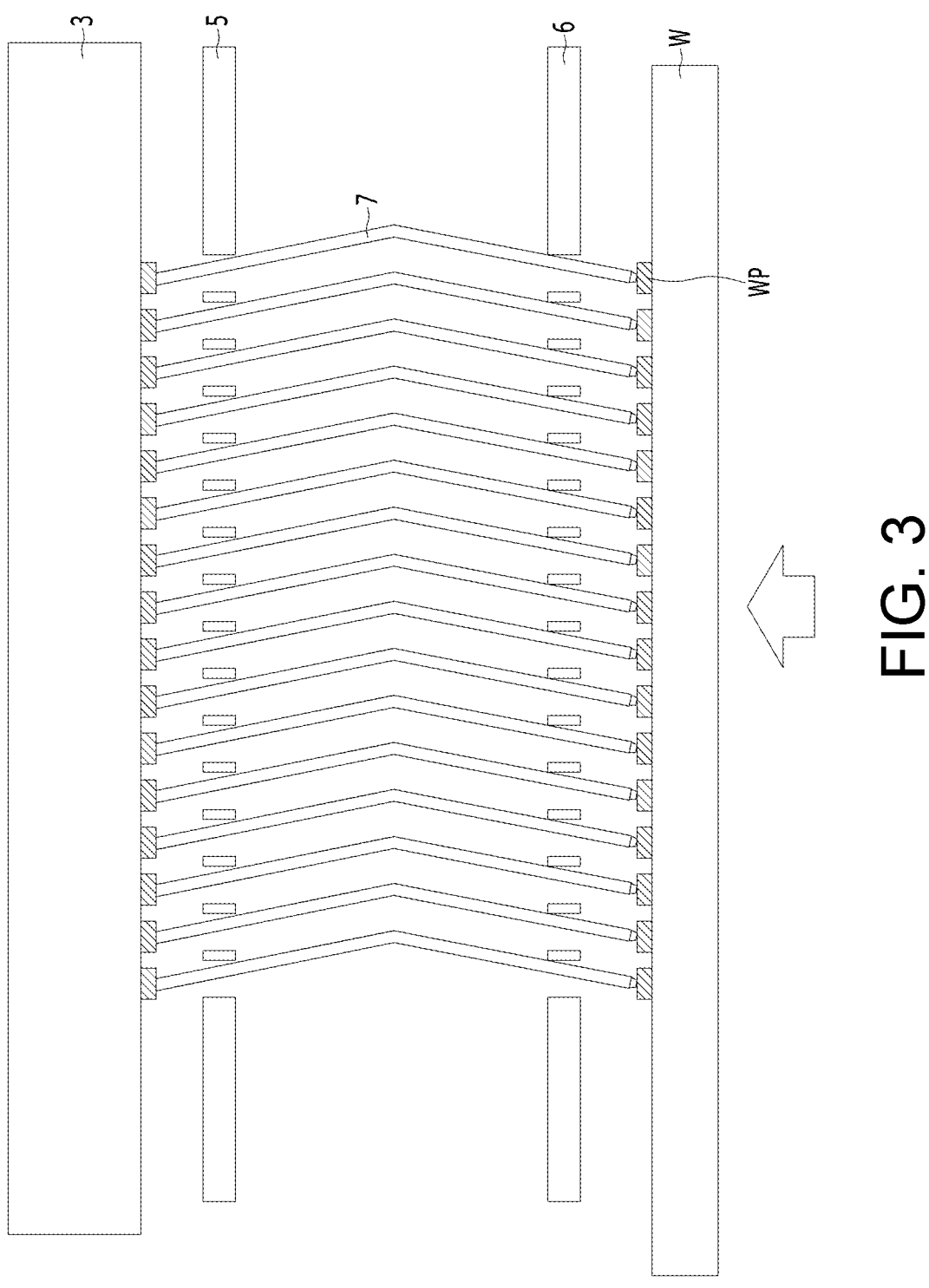
Figure 4:
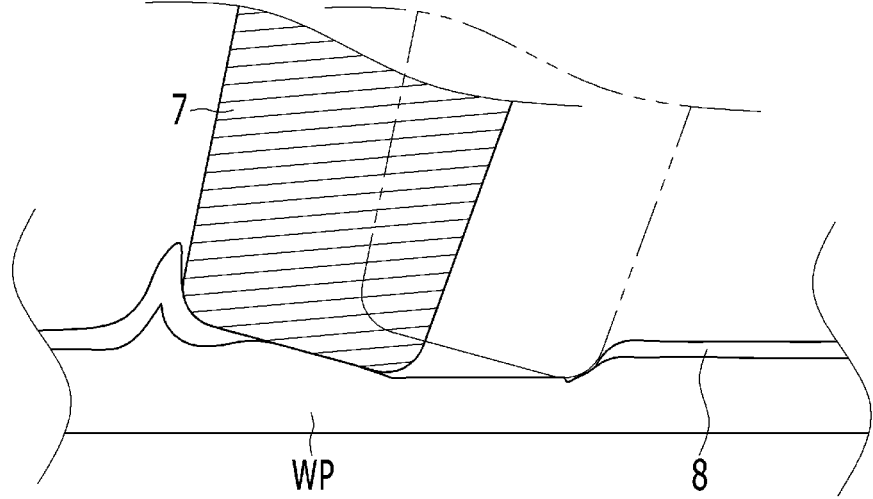
FIG. 4 is a view illustrating a wiping process of a probe pin according to the related art.
Figure 5:
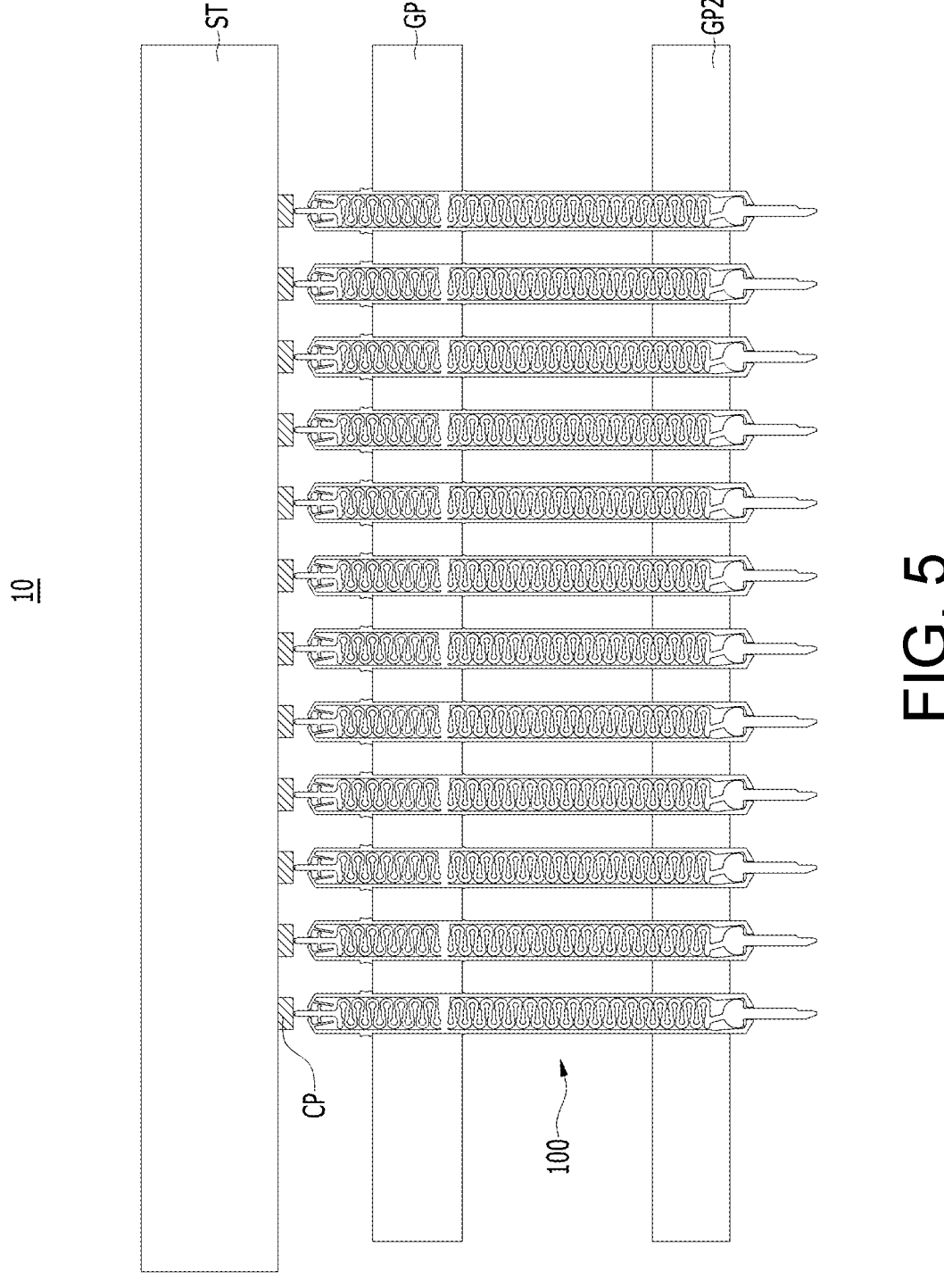
FIG. 5 is a view illustrating a state in which a plurality of probe pins of the vertical probe card according to an exemplary embodiment of the present disclosure are installed in an upper guide plate and a lower guide plate.
Figure 6A:
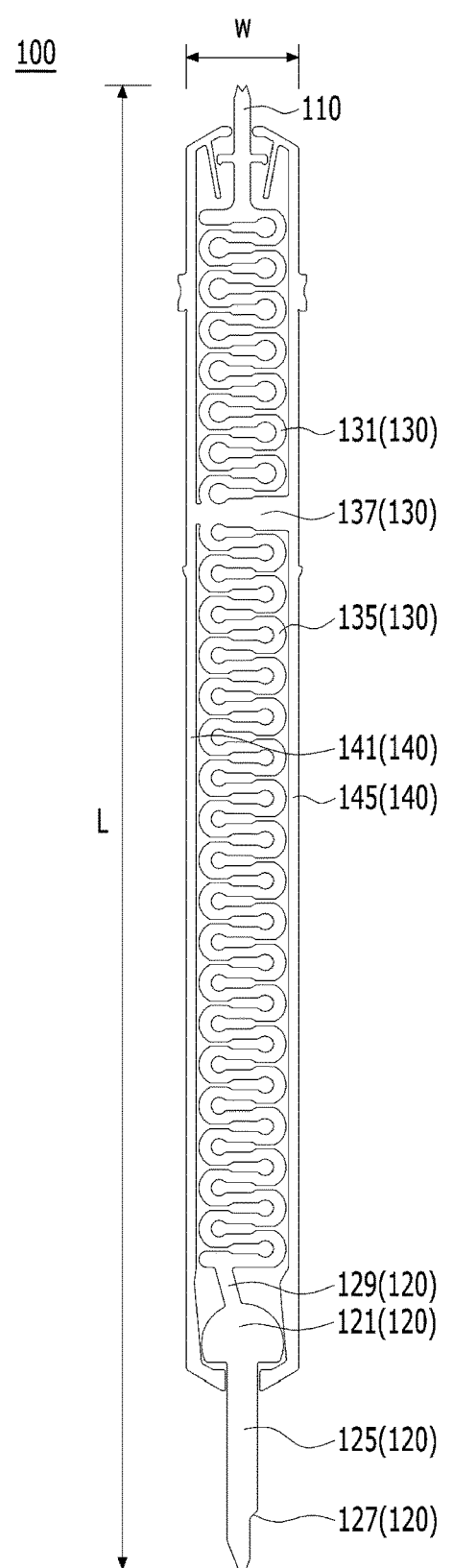
FIG. 6a is a plan view illustrating a probe pin of the vertical probe card according to the exemplary embodiment of the present disclosure.
Figure 6B:
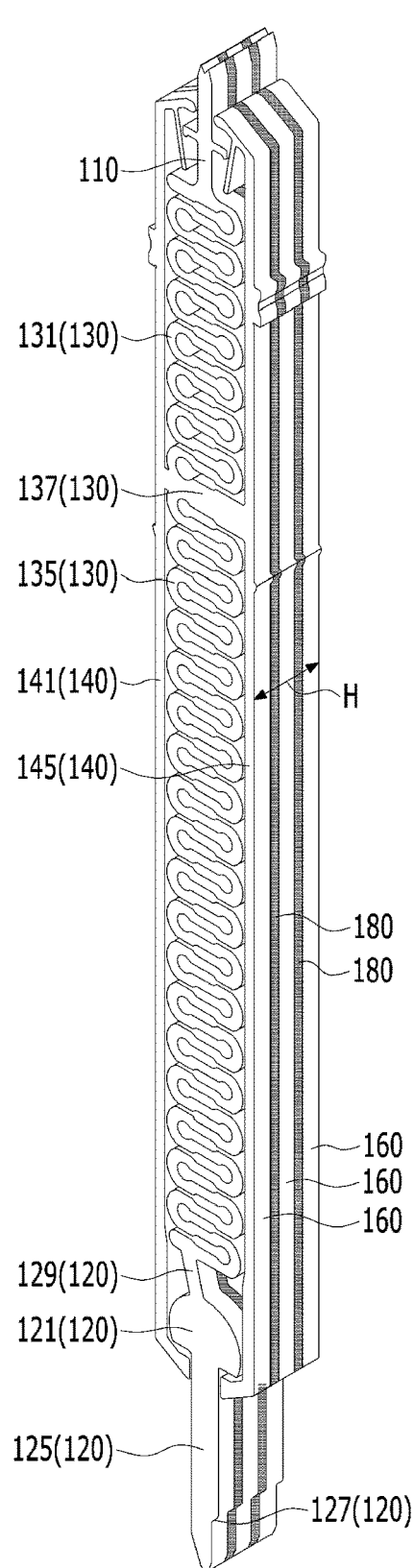
FIG. 6b is a perspective view illustrating the probe pin of the vertical probe card according to the exemplary embodiment of the present disclosure.
Figure 7A:
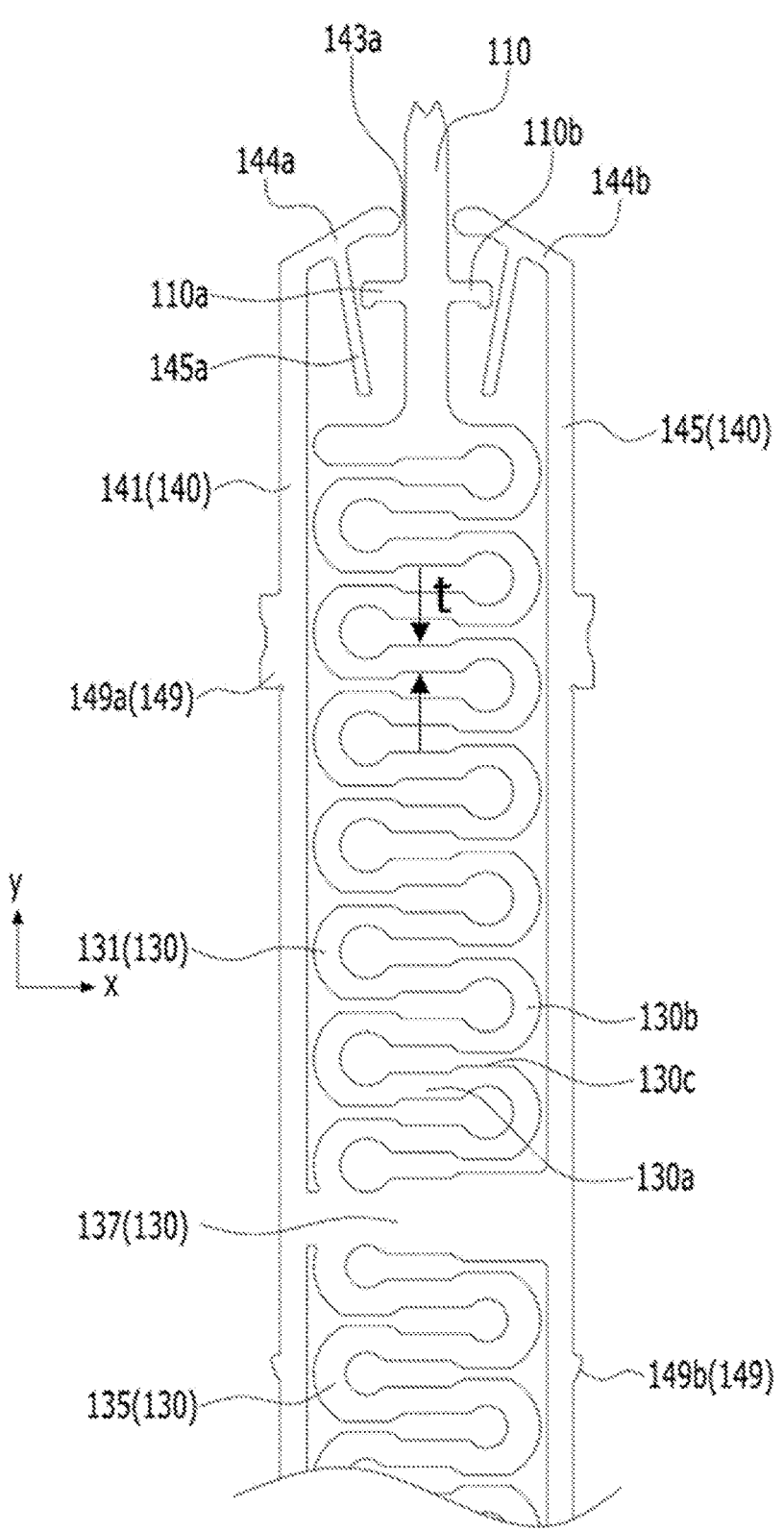
FIG. 7a is a plan view illustrating an upper portion of the probe pin of the vertical probe card according to the exemplary embodiment of the present disclosure.
Figure 7B:
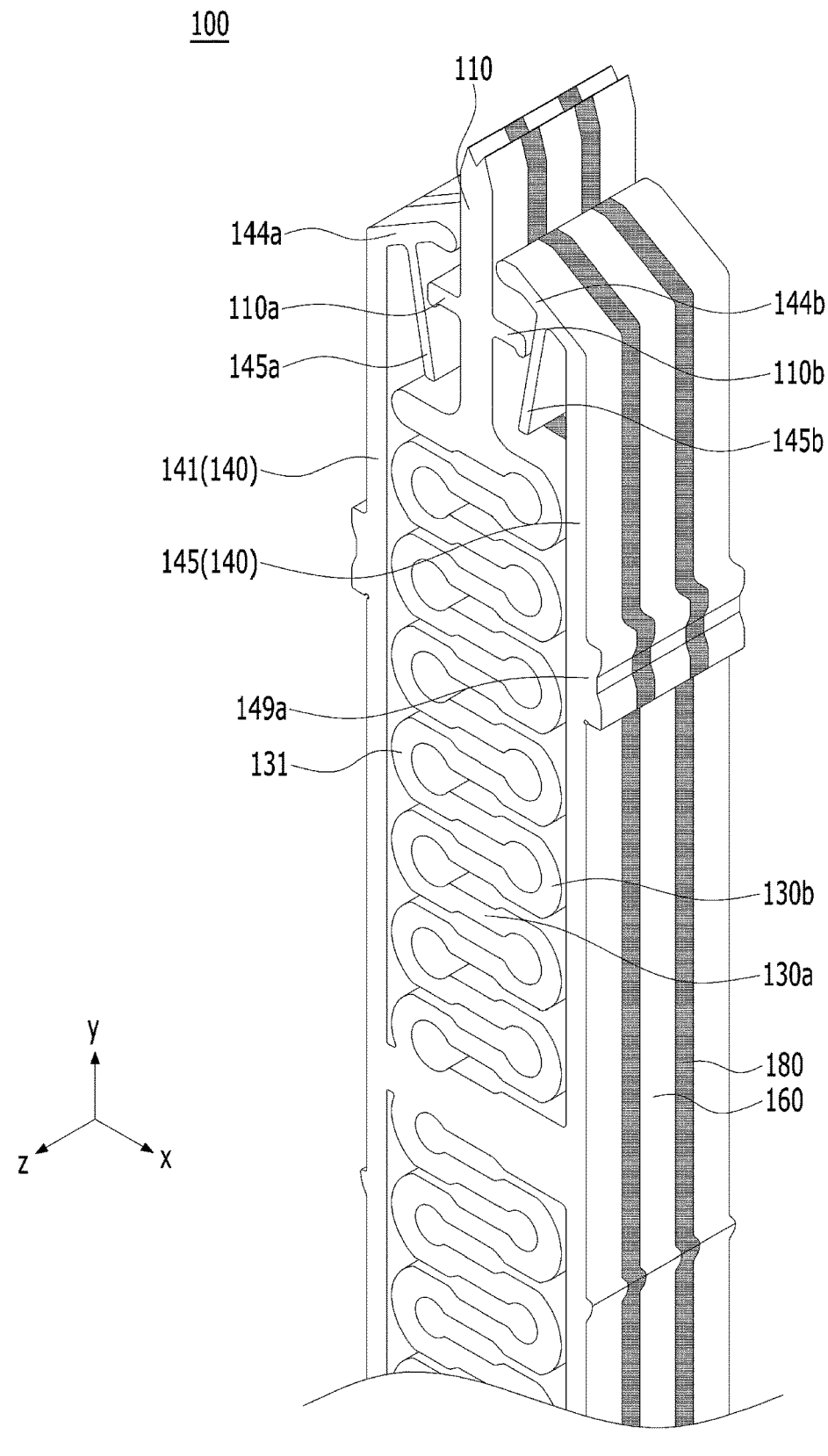
FIG. 7b is a perspective view illustrating the upper portion of the probe pin of the vertical probe card according to the exemplary embodiment of the present disclosure.
Figure 8A:
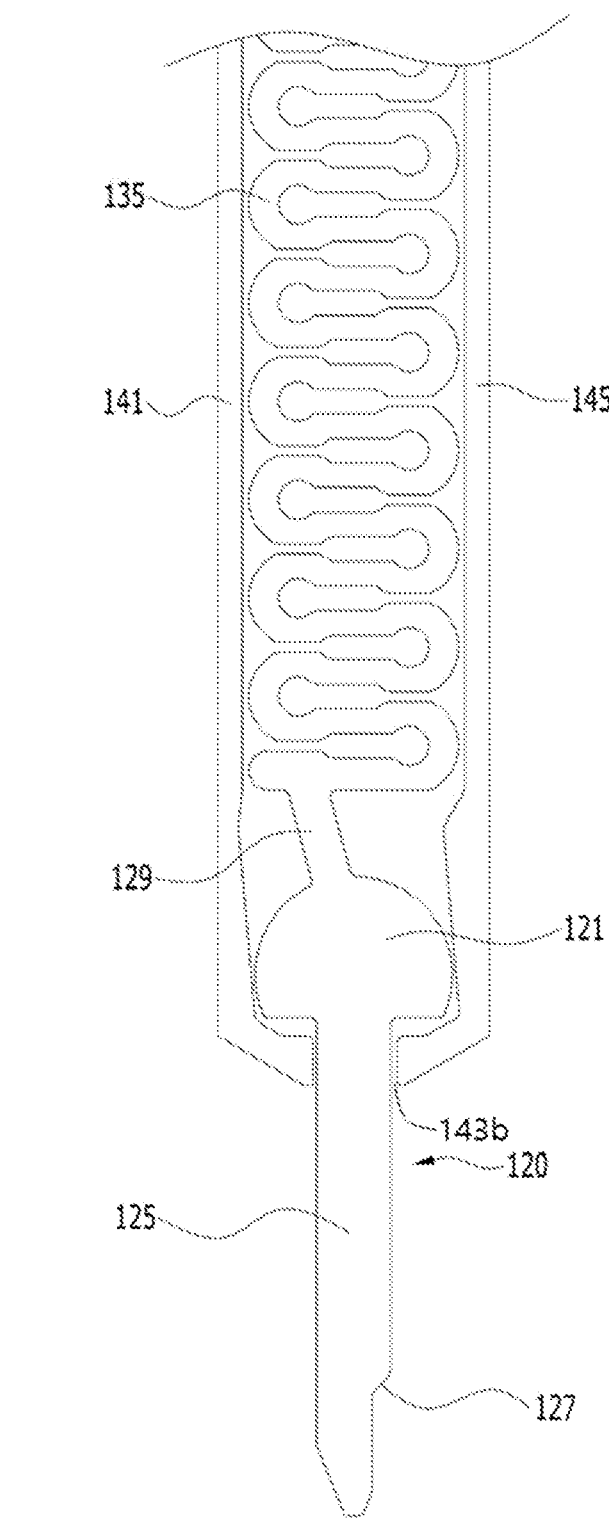
FIG. 8a is a plan view illustrating a lower portion of the probe pin of the vertical probe card according to the exemplary embodiment of the present disclosure.
Figure 8B:
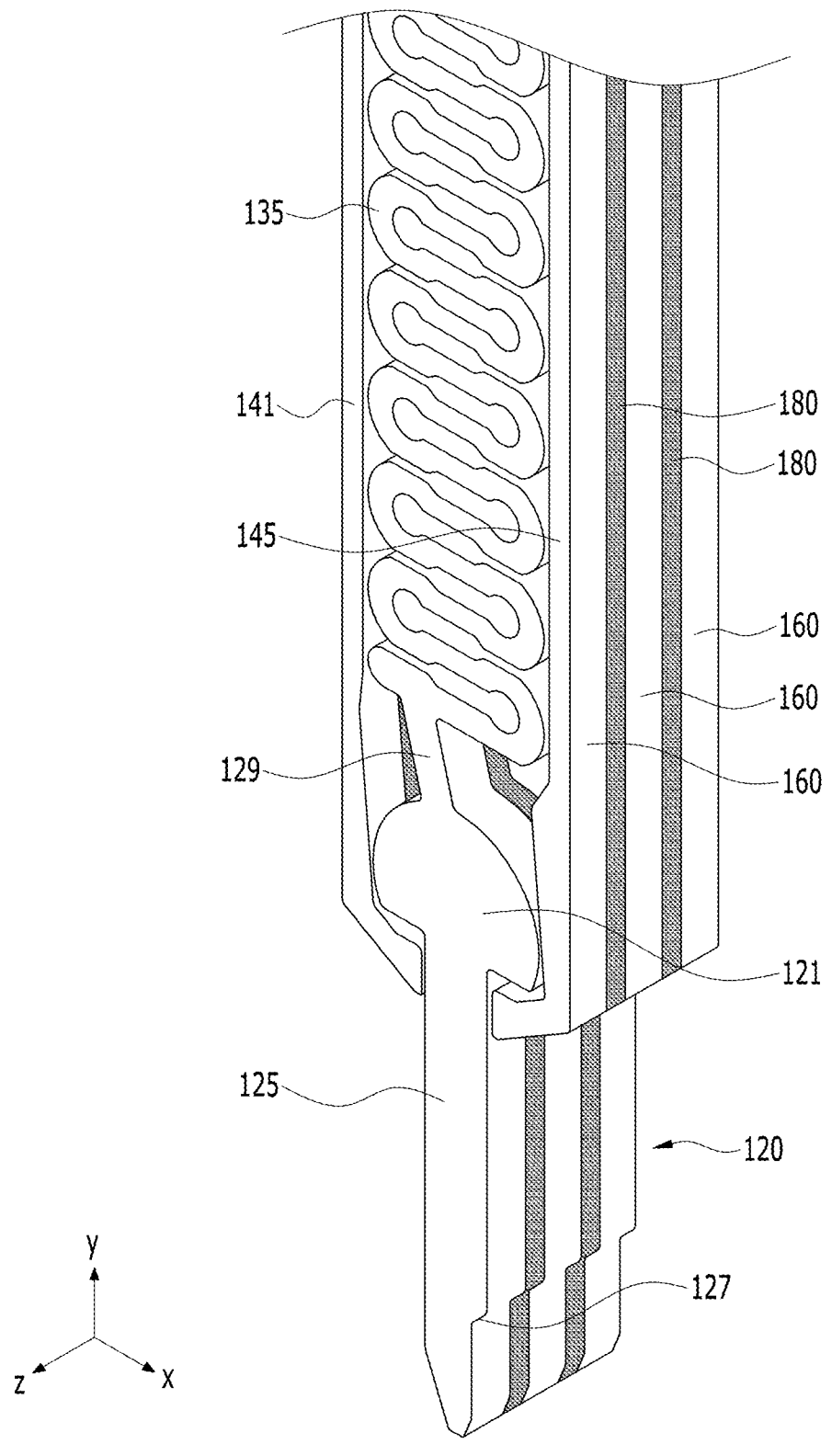
FIG. 8b is a perspective view illustrating the lower portion of the probe pin of the vertical probe card according to the exemplary embodiment of the present disclosure.
Figure 8C:
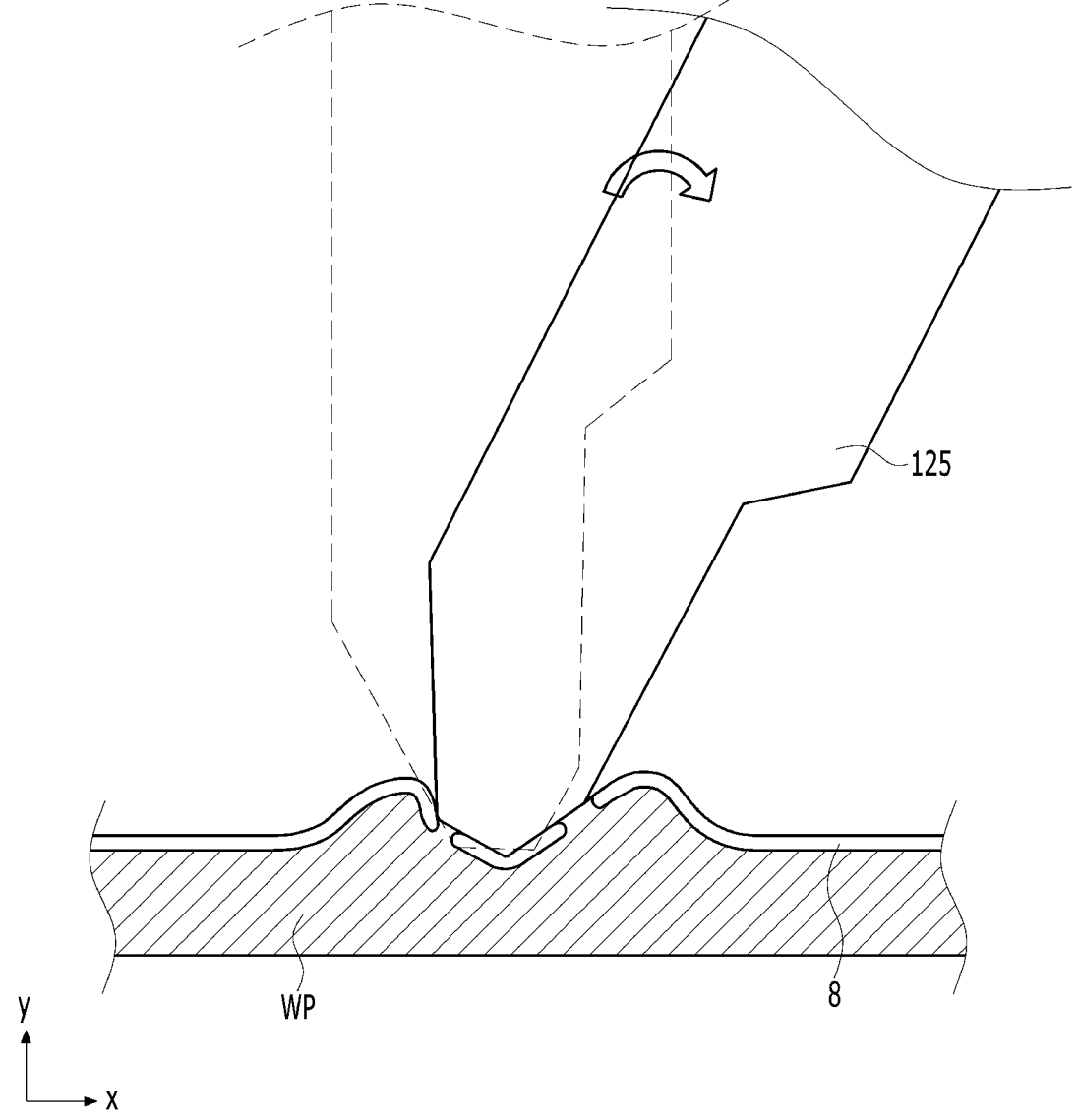
FIG. 8c is a view illustrating a wiping operation of the probe pin of the vertical probe card according to the exemplary embodiment of the present disclosure.

FIG. 5 is a view illustrating a state in which a plurality of probe pins 100 of the vertical probe card according to the exemplary embodiment of the present disclosure are installed in an upper guide plate GP1 and a lower guide plate GP2. FIG. 6*a* is a plan view illustrating a probe pin 100 of the vertical probe card according to the exemplary embodiment of the present disclosure. FIG. 6*b* is a perspective view illustrating the probe pin 100 of the vertical probe card according to the exemplary embodiment of the present disclosure. FIG. 7*a* is a plan view illustrating an upper portion of the probe pin 100 of the vertical probe card according to the exemplary embodiment of the present disclosure. FIG. 7*b* is a perspective view illustrating the upper portion of the probe pin 100 of the vertical probe card according to the exemplary embodiment of the present disclosure. FIG. 8*a* is a plan view illustrating a lower portion of the probe pin 100 of the vertical probe card according to the exemplary embodiment of the present disclosure. FIG. 8*b* is a perspective view illustrating the lower portion of the probe pin 100 of the vertical probe card according to the exemplary embodiment of the present disclosure. FIG. 8*c* is a view illustrating a wiping operation of the probe pin 100 of the vertical probe card according to the exemplary embodiment of the present disclosure. FIGS. 9*a* to 9*d* are views illustrating a method of manufacturing the probe pin 100 of the vertical probe card according to the exemplary embodiment of the present disclosure. FIG. 10 is a view illustrating a state in which the plurality of probe pins 100 of the vertical probe card according to the exemplary embodiment of the present disclosure are supported by a support mold SM. FIG. 11 is a view illustrating a side surface of the probe pin 100 of the vertical probe card according to the exemplary embodiment of the present disclosure. FIGS. 12 and 13 are views illustrating a comparison between the vertical probe card according to the exemplary embodiment of the present disclosure and a vertical probe card according to the related art.

The vertical probe card 10 according to the exemplary embodiment of the present disclosure is used in a test process of testing chips manufactured on a wafer during a semiconductor manufacturing process, and is capable of coping with a narrower pitch. The vertical probe card 10 according to the exemplary embodiment of the present disclosure is more useful for testing non-memory semiconductor chips such as microprocessors, microcontrollers, and ASICs.

The vertical probe card 10 according to the exemplary embodiment of the present disclosure includes a space transformer ST having a connection pad CP; the guide plates GP1 and GP2 provided under the space transformer ST so as to be spaced apart from the space transformer ST; and the probe pin 100 inserted and installed into a hole of each of the guide plates GP1 and GP2.

The probe pin 100 includes: a first plunger 110 positioned at the upper portion thereof and connected to the connection pad CP of the space transformer ST; a second plunger 120 positioned at the lower portion thereof and connected to a chip; and an elastic portion 130 elastically displacing the first plunger 110 and the second plunger 120 in the length direction of the probe pin 100. The elastic portion 130 has a uniform cross-sectional shape in the thickness direction of the probe pin 100, and the elastic portion 130 has a uniform thickness in the width direction and the length direction of the probe pin 100.

In addition, the probe pin 100 includes a support portion 140 provided outside the elastic portion 130 along the length direction of the probe pin 100 so as to guide the elastic portion 130 to be compressed and extended in the length direction of the probe pin 100 and prevent the elastic portion 130 from being buckled when compressed.

As the first plunger 110 is vertically moved downward inside the support portion 140, an additional contact point is formed between the first plunger 110 and the support portion 140.

The second plunger 120 moves vertically upward inside the support portion 140 and performs a wiping operation at a second contact point. During an overdrive process in which the probe pin 100 tests the chip, the support portion 140 of the probe pin 100 maintains a vertical state, and the second plunger 120 performs the wiping operation on the chip as it is tilted while maintaining a contact pressure with the chip.

The pitch between the probe pins 100 installed in the guide plates GP1 and GP2 of the vertical probe card 10 is in the rage of 50 μm to 150 μm. The lateral width of the probe pin 100 is in the range of 40 μm to 200 μm, and the thickness of the probe pin 100 is in the range of 40 μm to 200 μm.

The probe pin 100 of the vertical probe card according to the exemplary embodiment of the present disclosure is provided by stacking a plurality of metal layers in the thickness direction of the probe pin 100. The plurality of metal layers include a first metal layer 160 and a second metal layer 180. The first metal layer 160 may be made of a metal having relatively high wear resistance compared to the second metal layer 180, preferably a metal selected from rhodium (Rh), platinum (Pt), iridium (Ir), palladium (Pd), nickel (Ni), manganese (Mn), tungsten (W), phosphorus (P), or an alloy thereof, or a palladium-cobalt (PdCo) alloy or a palladium-nickel (PdNi) alloy, or a nickel-phosphorus (NiP) alloy, a nickel-manganese (NiMn) alloy, a nickel-cobalt (NiCo) alloy, or a nickel-tungsten (NiW) alloy. The second metal layer 180 may be made of a metal having relatively high electrical conductivity compared to the first metal layer 160, preferably a metal selected from copper (Cu), silver (Ag), gold (Au), or an alloy thereof.

The first metal layer 160 is disposed on each of the upper and lower sides in the thickness direction of the probe pin 100, and the second metal layer 180 is disposed between the first metal layers 160. For example, the probe pin 100 is provided by sequentially stacking the first metal layer 160, the second metal layer 180, and the first metal layer 160, and the number of stacked layers is at least three.

The probe pin 100 of the vertical probe card according to the exemplary embodiment of the present disclosure includes: the first plunger 110 located at a first end side of the probe pin 100 and having an end serving as a first contact point; the second plunger 120 located at a second end side of the probe pin 100 and having an end serving as a second contact point; the elastic portion 130 elastically displacing the first plunger 110 and the second plunger 120 in the length direction of the probe pin 100; and the support portion 140 guiding the elastic portion 130 to be compressed and extended in the length direction of the probe pin 100 and provided outside the elastic portion 130 along the length direction of the probe pin 100 so as to prevent the elastic portion 130 from being bent or curved in the horizontal direction when compressed.

The probe pin 100 is inserted into a guide hole of the upper guide plate GP1 and a guide hole of the lower guide plate GP2.

The first contact point of the first plunger 110 is connected to the connection pad CP of the space transformer ST, and the second plunger 120 is connected to a connection pad of a test object. Here, the test object may be a semiconductor chip.

The elastic portion 130 includes: a first elastic portion 131 connected to the first plunger 110; a second elastic portion 135 connected to the second plunger 120; and an intermediate fixing portion 137 connected to the first elastic portion 131 and the second elastic portion 135 between the first elastic portion 131 and the second elastic portion 135 and provided integrally with the support portion 140. The elastic portion 130 has a uniform cross-sectional shape in the thickness direction of the probe pin 100. In addition, the elastic portion 130 has a uniform thickness throughout. Each of the first and second elastic portions 131 and 135 is formed by repeatedly bending a plate having an actual width t in an "S" shape, and the actual width t of the plate is uniform throughout. The ratio of the actual width t of the plate to the thickness of the plate is in the range of 1:5 to 1:30.

Before the probe pin 100 tests the semiconductor chip, the first plunger 110 is in a state in contact with the connection pad CP so that the first elastic portion 131 is compressively deformed in the length direction of the probe pin 100, and the second plunger 120 is in a state not in contact with the chip. Whereas, when the probe pin 100 tests the chip, the second plunger 120 is brought into contact with the chip so that the second elastic portion 135 is compressively deformed.

The first plunger 110 has a first end serving as a free end and a second end connected to the first elastic portion 131 so that the first plunger 110 is elastically movable vertically by contact pressure. The second plunger 120 has a first end serving as a free end and a second end connected to the second elastic portion 135 so that the second plunger 120 is elastically movable vertically by contact pressure.

The first elastic portion 131 has a first end connected to the first plunger 110 and a second end connected to the intermediate fixing portion 137. The second elastic portion 135 has a first end connected to the second plunger 120 and a second end connected to the intermediate fixing portion 137.

The support portion 140 includes a first support portion 141 provided at a left side of the elastic portion 130 and a second support portion 145 provided at a right side of the elastic portion 130.

A locking portion 149 is provided on an outer wall of the support portion 140 so that the support portion 140 is caught and fixed to the upper guide plate GP1. The locking portion 149 includes an upper locking portion 149a caught on an upper surface of the upper guide plate GP1 and a lower locking portion 149b caught on a lower surface of the upper guide plate GP1.

The intermediate fixing portion 137 is formed to extend in the width direction of the probe pin 100, and connects the first support portion 141 and the second support portion 145 to each other.

The first elastic portion 131 is provided above the intermediate fixing portion 137, and the second elastic portion 135 is provided below the intermediate fixing portion 137.

The first elastic portion 131 and the second elastic portion 135 are compressed or extended with respect to the intermediate fixing portion 137. The intermediate fixing portion 137 is fixed to the first and second support portions 141 and 145 and functions to limit the movement of the first and second elastic portions 131 and 135 when the first and second elastic portions 131 and 135 are compressively deformed.

The intermediate fixing portion 137 separates a region in which the first elastic portion 131 is provided and a region in which the second elastic portion 135 is provided. Therefore, foreign substances introduced into an upper opening 143*a* are blocked from flowing toward the second elastic portion 135, and foreign substances introduced into a lower opening 143*b* are also blocked from flowing toward the first elastic portion 131. With this, the movement of the foreign substances introduced into the support portion 140 is limited, thereby preventing the operation of the first and second elastic portions 131 and 135 from being disturbed by the foreign substances.

The first support portion 141 and the second support portion 145 are formed along the length direction of the probe pin 100. The first support portion 141 and the second support portion 145 are integrally connected to the intermediate fixing portion 137 extending along the width direction of the probe pin 100. In addition, the first and second elastic portions 131 and 135 are integrally connected to each other through the intermediate fixing portion 137, so that the probe pin 100 is constructed as a single body.

Each of the first and second elastic portions 131 and 135 is formed by alternately connecting a plurality of straight portions 130*a* and a plurality of curved portions 130*b*. Each of the straight portions 130*a* connects the curved portions 130*b* adjacent in the left and right directions, and each of the curved portions 130*b* connects the straight portions 130*a* adjacent in the upper and lower directions. The curved portions 130*b* have an arc shape.

The straight portions 130*a* are disposed at a central portion of each of the first and second elastic portions 131 and 135, and the curved portions 130*b* are disposed at outer peripheral portions of each of the first and second elastic portions 131 and 135. The straight portions 130*a* are provided parallel to the width direction so that the curved portions 130*b* can be more easily deformed by contact pressure.

The first and second elastic portions 131 and 135 are connected to the intermediate fixing portion 137 at the curved portions 130*b* of the first and second elastic portions 131 and 135. With this, the first and second elastic portions 131 and 135 maintain elasticity with respect to the intermediate fixing portion 137.

While the first elastic portion 131 requires an amount of compression sufficient to allow respective first plungers 110 of the plurality of probe pins 100 to make stable contact with respective connection pads CP of the space transformer ST, the second elastic portion 135 requires an amount of compression sufficient to allow respective second plungers 120 of the plurality of probe pins 100 to make stable contact with respective chips. Therefore, the first elastic portion 131 and the second elastic portion 135 have different spring coefficients from each other. For example, the first elastic portion 131 and the second elastic portion 135 are provided to have different lengths from each other. Also, the length of the second elastic portion 135 may be longer than that of the first elastic portion 131.

A flat portion 130*c* is provided at each of upper and lower portions of each of the curved portions 130*b*. The flat portion 130*c* has a flat surface shape. The flat portions 130*c* adjacent in the upper and lower directions are brought into surface contact with each other when the first and second elastic portions 131 and 135 are deformed. During test, as the first and second elastic portions 131 and 135 are compressed, the flat portions 130*c* adjacent in the upper and lower directions are brought into surface contact with each other. With this, electrical signal transmission can be quickly and stably performed through the curved portions 130*b* provided at the outer peripheral portions of the first and second elastic portions 131 and 135.

Each of the curved portions 130*b* is connected to two straight portions 130*a*. The two straight portions 130*a* are located within a range that does not exceed the distance between opposite sides of each of the curved portions 130*b*. One straight line portion 130*a* is connected to a first side of each of the curved portions 130*b* bent downward from the upper portion thereof, and the other straight portion 130*a* is connected to a second side of each of the curved portions 130*b* bent upwardly from the lower portion thereof. Thus, the distance between the two straight portions 130*a* connected to one curved portion 130*b* does not exceed the distance between opposite sides of the one curved portion 130*b*. With this, it is possible to provide more curved portions 130*b* and straight portions 130*a* within the same length range of the elastic portion 130, so that the first and second elastic portions 131 and 135 can have sufficient elasticity. As a result, it is possible to shorten the length of the elastic portion 130.

Meanwhile, the distance between the curved portions 130*b* adjacent in the upper and lower directions is shorter than that between the straight portions 130*a* adjacent in the upper and lower directions. With this, when the first and second elastic portions 131 and 135 are compressed, the curved portions 130*b* adjacent in the upper and lower directions are brought into contact with each other first to form a current path through the curved portions 130*b*, and then when an additional overdrive is applied, the first and second elastic portions 131 and 135 are further deformed through the straight portions 130*a* adjacent in the upper and lower directions.

Opposite ends of the first support portion 141 and opposite ends of the second support portion 145 are close to each other but spaced apart from each other to form openings. The openings include the upper opening 143*a* allowing the first plunger 110 to pass therethrough in the vertical direction and the lower opening 143*b* allowing the second plunger 120 to pass therethrough in the vertical direction. The upper opening 143*a* and the lower opening 143*b* function to prevent the first and second plungers 110 and 120 from excessively protruding from the support portion 140 by a restoring force of the first and second elastic portions 131 and 135.

The first support portion 141 includes a first door portion 144*a* extending toward the upper opening 143*a*, and the second support portion 145 includes a second door portion 144*b* extending toward the upper opening 143*a*. The first door portion 144*a* and the second door portion 144*b* face each other and are spaced apart from each other by a gap that defines the upper opening 143*a*. The width of the upper opening 143*a* is configured to be smaller than the lateral length of the straight portions 130*a* of the first elastic portion 131.

The first plunger 110 is connected to a straight portion 130*a* of the first elastic portion 131 and has a rod shape extending in the length direction of the probe pin 100. The first plunger 110 vertically passes through the upper opening 143*a* formed by the first support portion 141 and the second support portion 145. In addition, since the lateral length of the straight portions 130*a* of the first elastic portion 131 is larger than the width of the upper opening 143*a*, the straight portions 130*a* of the first elastic portion 131 do not pass through the upper opening 143a. With this, an upward stroke of the first plunger 110 is limited.

The end of the first support portion 141 and the end of the second support portion 145 are close to each other but spaced apart from each other to form the upper opening 143a allowing the first plunger 110 to pass therethrough in the vertical direction. When the first plunger 110 is vertically moved downward inside the support portion 140, the width of the upper opening 143a is reduced to cause the first and second support portions 141 and 145 to be brought into contact with each other to form an additional contact point.

The first support portion 141 includes a first extension portion 145a extending toward the inside of the support portion 140, and the second support portion 145 includes a second extension portion 145b extending toward the inside of the support portion 140.

The first extension portion 145a is connected to the first door portion 144a. The first extension portion 145a has a first end connected to the first door portion 144a and a second end extending toward the inside of the support portion 140 and serving as a free end.

The second extension portion 145b is connected to the second door portion 144b. The second extension portion 145b has a first end connected to the second door portion 144b and a second end extending toward the inside of the support portion 140 and serving as a free end.

The first plunger 110 includes a first protruding piece 110a extending toward the first extension portion 145a and a second protruding piece 110b extending toward the second extension portion 145b. When the first plunger 110 is moved downward by a pressing force, the first protruding piece 110a and the second protruding piece 110b are brought into contact with the first and second extension portions 145a and 145b, respectively.

As the first plunger 110 is moved downward, the first protrusion piece 110a and the second protrusion piece 110b are brought into contact with the first extension portion 145a and the second extension portion 145b, respectively, to form additional contact points.

The first extension portion 145a and the second extension portion 145b are formed to be inclined. Thus, when the first plunger 110 is vertically moved downward, the first protrusion piece 110a and the second protrusion piece 110b press the first extension portion 145a and the second extension portion 145b, respectively, so that the gap between the first door portion 144a and the second door portion 144b is reduced. In other words, as the first plunger 110 is vertically moved downward, the first door portion 144a and the second door portion 144b are deformed to approach each other, thereby reducing the width of the upper opening 143a. As such, when the first plunger 110 is moved downward inside the support portion 140, the first and second support portions 141 and 145 and the first plunger 110 are brought into contact with each other as the width of the upper opening 143a is reduced, thereby forming additional contact points.

As the first plunger 110 is moved downward, the first and second protruding pieces 110a and 110b and the first and second extension portions 145a and 145b are primarily brought into contact with each other to form additional contact points, and as the first plunger 110 is further moved downward, the first and second door portions 144a and 144b and the first plunger 110 are secondarily brought into contact with each other to form additional contact points. Due to the vertical downward movement of the first plunger 100, an additional current path is formed between the first plunger 110 and the support portion 140. This additional current path is formed directly from the support portion 140 to the first plunger 110 without passing through the elastic portion 130. Due to the formation of the additional current path, a more stable electrical connection is possible.

The width of the upper opening 143a is reduced in proportion to the downward movement distance of the first plunger 110. In addition, when a downward pressure is applied to the first plunger 110 even after the contact of the first and second door portions 144a and 144b with the first plunger 110, a frictional force between the first and second door portions 144a and 144b and the first plunger 110 is further increased. The increased frictional force prevents excessive downward movement of the first plunger 110. With this, it is possible to prevent excessive compression deformation of the elastic portion 130 (more specifically, the first elastic portion 131).

The second plunger 120 is connected to the second elastic portion 135 at an upper portion thereof, with an end passing through the lower opening 143b.

The second plunger 120 includes a connecting portion 129 connected to the elastic portion 130, a protruding tip 125 providing a second contact point, and an inner body 121 provided between the connecting portion 129 and the protruding tip 125 and not separated to the outside of the support portion 140.

A first end of the connecting portion 129 is connected to the elastic portion 130, more specifically, the second elastic portion 135, and a second end of the connecting portion 129 is connected to the inner body 121.

The second plunger 120 repeatedly performs upward and downward movement operations. At this time, the second plunger 120 and the support portion 140 located laterally thereof are brought into sliding contact with each other. The inner body 121 is configured in a hemispherical shape when viewed in a plan view to minimize a sliding friction force between the second plunger 120 and the support portion 140. The inner body 121 has minimal frictional resistance with respect to the support portion 140 due to the hemispherical shape thereof.

The inner body 121 is a portion located inside the support portion 140. The lateral length of a lower surface of the inner body 121 is configured to be larger than the width of the lower opening 143b to prevent the inner body 121 from being separated from the support portion 140.

A stepped portion 127 is provided at the protruding tip 125 of the second plunger 120. The stepped portion 127 is formed such that the width of the second plunger 120 increases from the second contact point toward the lower opening 143b at a portion of the second plunger 120 protruding from the support portion 140.

During a wiping operation of the second plunger 120, shavings are generated from an oxide layer 8. The shavings are electrodeposited and agglomerated together, and these shavings are caught on the stepped portion 127 and induced to fall naturally and are prevented from continuously growing. In addition, the stepped portion 127 functions to prevent the shavings from moving to the inside of the support portion 140.

As the second plunger 120 is vertically moved upward inside the support portion 140, the second contact point thereof performs a wiping operation. The second elastic portion 135 of the elastic portion 130 is connected to the second plunger 120 at a position eccentric to the axial line of the second plunger 120 so that the second plunger 120 performs the wiping operation at the second contact point when the second plunger 120 is moved upward.

The connecting portion 129 is inclined with an inclination angle and is connected to the second elastic portion 135 and a spherical surface of the inner body 121. A first end of the connecting portion 129 is connected to the spherical surface of the inner body 121 at a position on or close to the axial line of the second plunger 120, and a second end of the connecting portion 129 is connected to the second elastic portion 135 at a position farther from the axial line than the first end. Preferably, the first end of the connecting portion 129 is connected to the inner body 121 at a position on the axial line of the inner body 121, and the second end of the connecting portion 129 is connected to the second elastic portion 135 at a position corresponding to a curved portion 130*b* of the second elastic portion 135.

When the second plunger 120 is moved upward, the inner body 121 receives a deflected repulsive force by the connecting portion 129 inclinedly connected to the second elastic portion 135 on an upper surface of the inner body 121. With this configuration, when the second plunger 120 is vertically moved upward by a pressing force, the inner body 121 receives an eccentric resistance force. The eccentric resistance force acts on an upper side of the inner body 121 to generate a rotational moment in the inner body 121. As a result, as illustrated in FIG. 8*c*, the protruding tip 125 of the second plunger 120 performs the wiping operation on the test object as it is tilted while maintaining an appropriate contact pressure with the test object.

As the protruding tip 125 of the second plunger 120 is tilted while maintaining the appropriate contact pressure, cracks are generated in the oxide layer 8, and a conductive material layer of the electrode pad WP is exposed through the cracks and is brought into contact with the protruding tip 125. As a result, an electrical connection is made. In addition, by the wiping operation, it is possible to minimize damage to the electrode pad WP and to extend the useable life of the probe pin 100 by not causing an excessive amount of shavings of the oxide layer 8.

The wiping degree against the electrode pad WP of the test object at the second contact point is controllable by the size of the gap between the lower opening 143*b* and the protruding tip 125. The gap between the lower opening 143*b* and the protruding tip 125 is a factor that determines an allowable tilting angle. The larger the gap between the lower opening 143*b* and the protruding tip 125, the larger the tilting angle of the second contact point of the protruding tip 125 is, and on the other hand, the smaller the gap between the lower opening 143*b* and the protruding tip 125, the smaller the tilting angle of the second contact point of the protruding tip 125 is.

In the related art, an oxide layer 8 on an electrode pad WP of a test object is removed as a probe pin 7 is buckled, i.e., bent or curved, by pressure applied to the opposite ends thereof and a contact point thereof performs a sliding operation. The oxide layer 8 may be easily removed by excessive pressure that causes the probe pin 7 to be curved in the width direction. However, there is a contradictory problem in that damage to the electrode pad WP is also increased. In particular, as the electrode pad WP is becoming smaller in response to the trend toward a narrower pitch, damage to the electrode pad WP by the probe pin 7 due to excessive contact pressure is becoming more frequent.

On the contrary, in the case of the probe pin 100 according to the exemplary embodiment of the present disclosure, when receiving a contact pressure, the second plunger 120 performs the wiping operation as the second elastic portion 135 is compressively deformed from a spring structure in which the plate is repeatedly bent in advance. Thus, it is possible prevent excessive pressure from being applied to the electrode pad WP, thereby minimizing damage to the electrode pad WP.

As described above, there is a difference in basic operating principle of the wiping operation between the probe pin 100 according to the exemplary embodiment of the present disclosure and the probe pin 7 according to the related art. In the case of the related art, the probe pin 7 itself performs the wiping operation as it is elastically deformed. Whereas, in the case of the present disclosure, the second plunger 120 performs the wiping operation as it is tilted while the support portion 140 maintains a vertical state.

Unlike the conventional wiping operation (conventional vertical probe card) of removing the oxide layer 8 by applying excessive contact pressure to the oxide layer 8 or the conventional wiping operation (conventional cantilever probe card) of removing the oxide layer 8 by scrubbing the oxide layer 8, the second plunger 120 according to the exemplary embodiment of the present disclosure removes the oxide layer 8 as it is tilted while maintaining an appropriate contact pressure at the second contact point, thereby minimizing damage to the electrode pad WP.

The first and second plungers 110 and 120, the elastic portion 130, and the support portion 140 are simultaneously manufactured using a plating process to form a single body. The probe pin 100 is configured such that plates are integrally connected to each other to constitute the first and second plungers 110 and 120, the elastic portion 130, and the support portion 140.

The plates constituting the probe pin 100 have a width. Here, the width means a distance between a first surface of the plates and a second surface thereof facing the first surface. The plates constituting the probe pin 100 have a minimum width corresponding to the smallest width and a maximum width corresponding to the largest width. The actual width t of the plates may be an average value of the widths of all the plates, or a median value of the widths of all the plates, or an average value or a median value of the widths of the plates corresponding to at least a part of the configurations constituting the probe pin 100, or an average value or a median value of the width of at least one of the plates corresponding to the elastic portion 130 and the support portion 140, or a value of the width obtained when the plates are continuous with the same width by equal to or larger than 5 μm.

Since the actual width t of the plates is configured to be smaller than the overall thickness H of the plates, a structure in which thin plates stand up in the thickness direction is formed.

The probe pin 100 is provided as a single body, and includes: the support portion 140 formed in the form of a plate extending in the length direction; the intermediate fixing portion 137 provided inside the support portion 140 and formed in the form of a plate extending in the width direction while crossing the support portion 140; the first elastic portion 131 formed in the form of a bent plate at the upper side of the intermediate fixing portion 137; the second elastic portion 135 formed in the form of a bent plate at the lower side of the intermediate fixing portion 137; the first plunger 110 formed in the form of a plate at an upper end of the first elastic portion 131; and the second plunger 120 formed in the form of a plate at a lower end of the second elastic portion 135. As described above, the probe pin 100 is provided as a single body in which the plates are integrally connected to each other.

The plates constituting the first and second plungers 110 and 120, the elastic portion 130, and the support portion 140 may be different from each other in the actual width t, but may have the same thickness.

The probe pin 100 according to the exemplary embodiment of the present disclosure is formed such that the actual width t of the plates is small while the overall thickness H of the plates is large. In other words, the overall thickness H is configured to be large compared to the actual width t of the plates. Preferably, the actual width t of the plates constituting the probe pin 100 is in the range of 5 μm to 15 μm, the overall thickness H of the plates is in the range of 40 μm to 200 μm, and the actual width t and the overall thickness H of the plates have a ratio in the range of 1:5 to 1:30. For example, the actual width t of the plates may be substantially 5 μm, and the overall thickness H of the plates may be 50 μm, so that the actual width t and the overall thickness H of the plates may have a ratio of 1:10.

According to the method of manufacturing the probe pin 100 according to the exemplary embodiment of the present disclosure, which will be described later, it is possible to make the actual width t of the plates constituting the elastic portion 130 equal to or less than 10 μm, more preferably 5 μm. Since it becomes possible to form the elastic portion 130 by bending the plates having an actual width t of 5 μm, it is possible to reduce the overall width W of the probe pin 100. As a result, it is possible to cope with a narrower pitch. In addition, since the overall thickness H is configured in the range of 40 μm to 200 μm, it is possible to shorten the length of the elastic portion 130 while preventing damage to the elastic portion 130. Also, it is possible for the elastic portion 130 to have an appropriate contact pressure by the configuration of the plate even when the length thereof is shortened. Furthermore, as it becomes possible to increase the overall thickness H compared to the actual width t of the plates constituting the elastic portion 130, the resistance to moments acting in the front and rear directions of the elastic portion 130 is increased, resulting in improved contact stability.

As it becomes possible to shorten the length of the elastic portion 130, the overall thickness H and the overall length L of the probe pin 100 have a ratio in the range of 1:3 to 1:9. Preferably, the overall length L of the probe pin 100 is in the range of 300 μm to 3 mm, and more preferably 450 μm to 600 μm. By shortening the overall length L of the probe pin 100 in this way, it is possible to effectively cope with high-frequency characteristics. Also, the elastic recovery time of the elastic portion 130 can be shortened, thereby shortening the test time.

The overall thickness H and the overall width W of the probe pin 100 have a ratio in the range of 1:1 to 1:5. Preferably, the overall thickness H of the probe pin 100 is in the range of 40 μm to 200 mm, and the overall width W of the probe pin 100 is in the range of 40 μm to 200 μm. By shortening the overall width W of the probe pin 100 in this way, it is possible to implement a narrower pitch.

Meanwhile, the overall thickness H and the overall width W of the probe pin 100 may be configured to be substantially the same. Thus, it is not necessary to join a plurality of separately manufactured probe pins 100 in the thickness direction so that the overall thickness H and the overall width W become substantially the same. In addition, as it becomes possible to make the overall thickness H and the overall width W of the probe pin 100 substantially the same, the resistance to moments acting in the front and rear directions of the probe pin 100 is increased, resulting in improved contact stability. Furthermore, with the configuration in which the overall thickness H of the probe pin 100 is equal to or larger than 70 μm and the ratio of the overall thickness H to the overall width W thereof is in the range of 1:1 to 1:5, overall durability and deformation stability of the probe pin 100 can be improved and thereby contact stability with the electrode pad WP can be improved. In addition, as the overall thickness H of the probe pin 100 is configured to be equal to or larger than 70 μm, it is possible to improve current carrying capacity.

When the probe pin 100 is manufactured using a photoresist mold, the overall thickness H is inevitably smaller than the overall width W. For example, in the case of the probe pin 100 thus manufactured, the overall thickness H may be less than 40 μm and the overall thickness H and the overall width W may have a ratio in the range of 1:2 to 1:10. Thus, the resistance to moments that deform the probe pin 100 in the front and rear directions by contact pressure is weak. In order to prevent problems occurring due to excessive deformation of the clastic portion 130 on front and rear surfaces of the probe pin 100, it should be considered to additionally form a housing on the front and rear surfaces of the probe pin 100. However, according to the exemplary embodiment of the present disclosure, an additional housing is not necessary.

The method of manufacturing the probe pin 100 of the vertical probe card according to the exemplary embodiment of the present disclosure will be described with reference to FIGS. 9a to 9d.

Figure 9A:
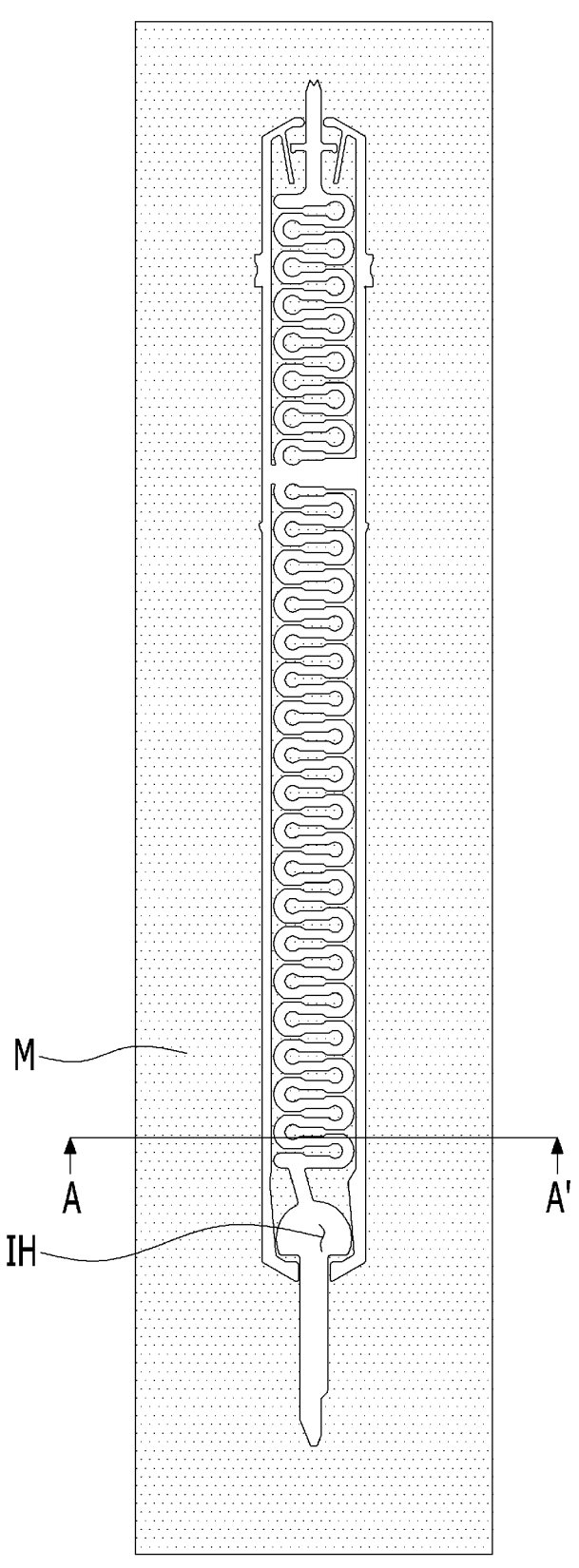
Figure 9B:
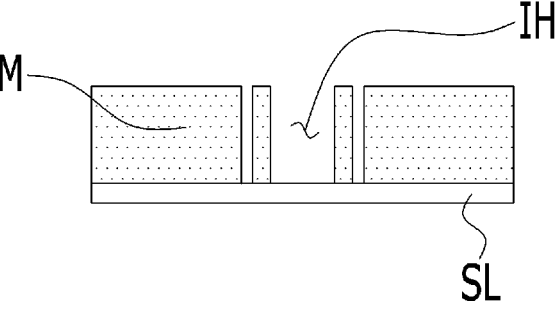

FIG. 9a is a plan view illustrating a mold M in which an inner space IH is formed. FIG. 9b is a sectional view taken along line A-A' of FIG. 9a. The mold M may be made of an anodic aluminum oxide film, a photoresist, a silicon wafer, or a material similar thereto. However, a more preferred material for the mold M is an anodic aluminum oxide film. Therefore, the probe pin 100 according to the exemplary embodiment of the present disclosure has an effect exhibited by the use of the mold M made of the anodic aluminum oxide film as well as an effect exhibited by the structural advantages. Hereinafter, the mold M made of the anodic aluminum oxide film will be described as a preferred embodiment of the mold M.

The anodic aluminum oxide film means a film formed by anodizing a metal as a base material, and pores mean holes formed in the process of forming the anodic aluminum oxide film by anodizing the metal. For example, when the metal as the base material is aluminum (Al) or an aluminum alloy, the anodization of the base material forms the anodic aluminum oxide film consisting of anodized aluminum ($Al_2O_3$) on a surface of the base material. However, the metal is not limited thereto, and includes Ta, Nb, Ti, Zr, Hf, Zn, W, Sb, or an alloy thereof. The resulting anodic aluminum oxide film includes a barrier layer in which no pores are formed therein vertically, and a porous layer in which the pores are formed therein. After removing the base material on which the anodic aluminum oxide film having the barrier layer and the porous layer is formed, only the anodic aluminum oxide film consisting of anodized aluminum ($Al_2O_3$) remains. The anodic aluminum oxide film may have a structure in which the barrier layer formed during the anodization is removed to expose the top and bottom of the pores, or a structure in which the barrier layer formed during the anodization remains to close one of the top and bottom of the pores.

The anodic aluminum oxide film has a coefficient of thermal expansion of 2 to 3 ppm/° C. With this, the anodic aluminum oxide film is less likely to undergo thermal deformation due to temperature when exposed to a high temperature environment. Thus, even when the probe pin 100 is manufactured in a high-temperature environment, a precise probe pin 100 can be manufactured without thermal deformation.

Since the probe pin 100 according to the exemplary embodiment of the present disclosure is manufactured using the mold M made of the anodic aluminum oxide film instead of a photoresist mold, there is an effect of realizing shape precision and a fine shape, which were limited in realization with the photoresist mold. In addition, when the conventional photoresist mold is used, a probe pin with a thickness of 40 μm can be manufactured, but when the mold M made of the anodic aluminum oxide film is used, the probe pin 100 with a thickness in the range of 40 μm to 200 μm can be manufactured.

A seed layer SL is provided on a lower surface of the mold M. The seed layer SL may be provided on the lower surface of the mold M before the inner space IH is formed in the mold M. Meanwhile, a support substrate (not illustrated) is formed under the mold M to improve handling of the mold M. In this case, the seed layer SL may be formed on an upper surface of the support substrate, and then the mold M having the inner space IH may be coupled to the support substrate. The seed layer SL may be made of copper (Cu), and may be formed by a deposition method.

The inner space IH may be formed by wet-etching the mold M made of the anodic aluminum oxide film. To this end, a photoresist may be provided on the upper surface of the mold M and patterned, and then the anodic aluminum oxide film in a patterned and open area may react with an etching solution to form the inner space IH.

Figure 9C:
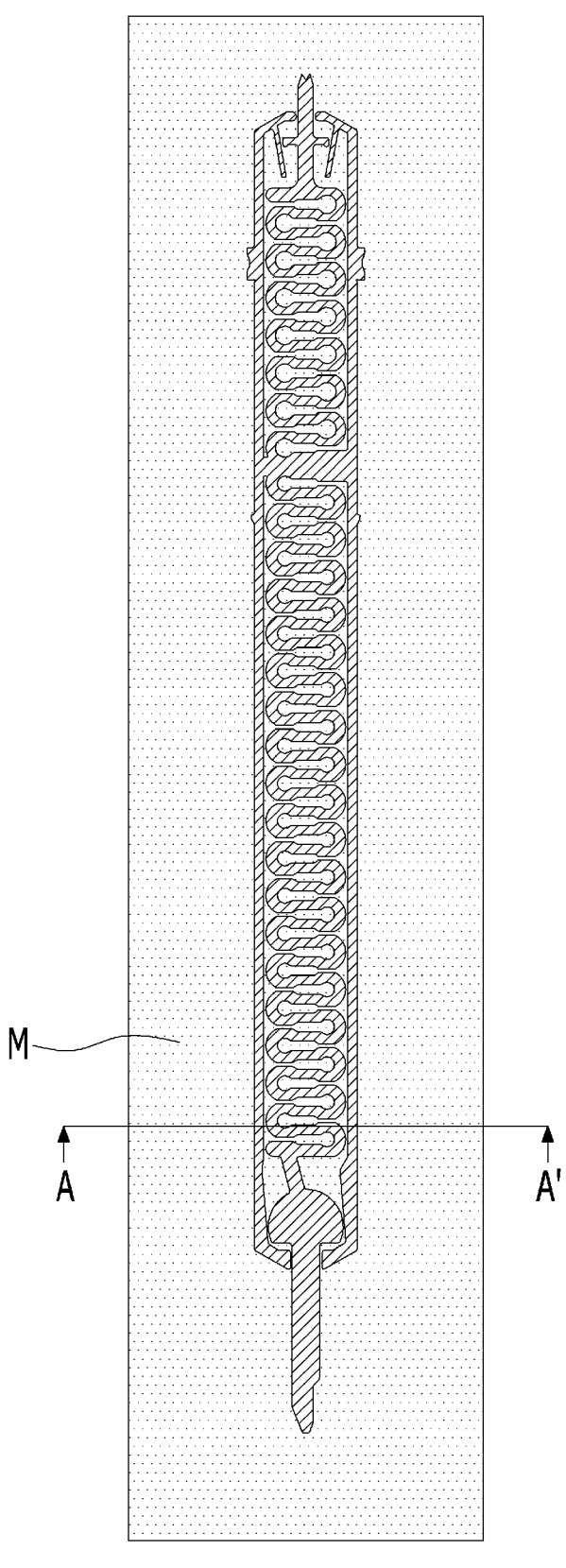
Figure 9D:
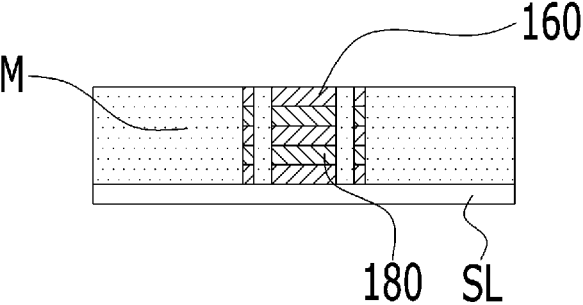

Thereafter, an electroplating process is performed in the inner space IH of the mold M to form the probe pin 100. FIG. 9c is a plan view illustrating the electroplating process performed in the inner space IH. FIG. 9d is a sectional view taken along line A-A' of FIG. 9c.

During the electroplating process, a plurality of metal layers are stacked in the thickness direction of the probe pin 100 by growing the metal layers in the thickness direction of the mold M, so the metal layers have a uniform cross-sectional shape in the thickness direction of the probe pin 100. The plurality of metal layers include a first metal layer 160 and a second metal layer 180. The first metal layer 160 may be made of a metal having relatively high wear resistance compared to the second metal layer 180, preferably a metal selected from rhodium (Rh), platinum (Pt), iridium (Ir), palladium (Pd), nickel (Ni), manganese (Mn), tungsten (W), phosphorus (P), or an alloy thereof, or a palladium-cobalt (PdCo) alloy or a palladium-nickel (PdNi) alloy, or a nickel-phosphorus (NiP) alloy, a nickel-manganese (NiMn) alloy, a nickel-cobalt (NiCo) alloy, or a nickel-tungsten (NiW) alloy. The second metal layer 180 may be made of a metal having relatively high electrical conductivity compared to the first metal layer 160, preferably a metal selected from copper (Cu), silver (Ag), gold (Au), or an alloy thereof.

The first metal layer 160 is provided on each of a lower surface and an upper surface of the probe pin 100 in the thickness direction, and the second metal layer 180 is provided between the first metal layers 160. For example, the probe pin 100 is provided by sequentially stacking the first metal layer 160, the second metal layer 180, and the first metal layer 160, and the number of stacked layers is at least three.

After the plating process is completed, the temperature is raised to a high temperature and pressure is applied to pressurize the metal layers on which the plating process is completed so that the first metal layer 160 and the second metal layer 180 are made more dense. When a photoresist is used as a mold, the process of raising the temperature to a high temperature and applying pressure cannot be performed because the photoresist exists around the metal layers after the plating process is completed. On the contrary, according to the exemplary embodiment of the present disclosure, since the mold M made of the anodic aluminum oxide film is provided around the metal layers on which the plating process is completed, even when the temperature is raised to a high temperature, it is possible to densify the first metal layer 160 and the second metal layer 180 with minimized deformation because of the low coefficient of thermal expansion of the anodic aluminum oxide film. Thus, it is possible to obtain the first metal layer 160 and the second metal layer 180 with a higher density compared to the technique using the photoresist as the mold.

When the electroplating process is completed, the mold M and the seed layer SL are removed. When the mold M is made of the anodic aluminum oxide film, the mold M is removed using a solution that selectively reacts with the anodic aluminum oxide film. In addition, when the seed layer SL is made of copper (Cu), the seed layer SL is removed using a solution that selectively reacts with copper (Cu).

FIG. 10 is a view illustrating a state in which the plurality of probe pins 100 of the vertical probe card according to the exemplary embodiment of the present disclosure are supported by the support mold SM. Although one probe pin 100 is illustrated in FIGS. 9a to 9c for convenience of description, the plurality of probe pins 100 are simultaneously manufactured in a form coupled to the support frame SM in consideration of productivity. In other words, as illustrated in FIG. 10, the manufacturing of the plurality of probe pins 100 is completed in a state coupled to the support frame SM. Until the probe pins 100 are inserted into the guide plates GP1 and GP2, the probe pins 100 are maintained in a state coupled to the support frame SM. When inserted into the guide plates GP1 and GP2, the probe pins 100 coupled to the support frame SM are removed from the support frame SM one by one and installed in the guide plates GP1 and GP2. This facilitates transfer and management of the probe pins 100.

According to the technique for manufacturing a probe pin by electroplating using a photoresist as a mold, it is difficult to sufficiently increase the height of the mold only with the use of a single-layer photoresist. As a result, it is also difficult to sufficiently increase the thickness of the probe pin. The probe pin needs to be manufactured with a predetermined thickness in consideration of electrical conductivity, restoring force, brittle fracture, etc. In order to increase the thickness of the probe pin, a mold in which photoresists are stacked in multiple layers may be used. However, in this case, each photoresist layer is slightly stepped, so that a problem occurs in that a side surface of the probe pin is not formed vertically and a stepped area minutely remains. In addition, when the photoresists are stacked in multiple layers, it is difficult to accurately reproduce the shape of the probe pin having a dimension range of equal to or less than several to several tens of μm. In particular, in the case of a photoresist mold, a photoresist is provided between inner spaces thereof. When the width of the photoresist provided between the inner spaces is equal to or less than 15 μm, the photoresist is not formed properly. In particular, when the height thereof is large compared to the width thereof, a problem occurs in that a standing state of the photoresist at the corresponding position is not properly maintained.

Therefore, when the photoresist is used as the mold, it may be difficult to make the ratio of the actual width to the overall thickness H of the plates constituting the probe pin 100 in the range of 1:5 to 1:30.

However, in manufacturing the probe pin 100 of the vertical probe card according to the exemplary embodiment of the present disclosure by using the mold M made of the anodic aluminum oxide film, there is an advantage in that it is easy to make the actual width and the overall thickness H of the plates constituting the probe pin 100 in the range of 1:5 to 1:30. Since the anodic aluminum oxide film is provided between inner spaces IH of the mold M made of the anodic aluminum oxide film, the anodic aluminum oxide film can maintain a standing state even when the distance between the inner spaces IH is in the range of 5 μm to 15 μm. As such, the use of the mold M made of the anodic aluminum oxide film makes it possible to make the overall thickness H of the probe pin 100 in the range of 70 μm to 200 μm, and to make the actual width t of the plates small in the range of 5 μm to 15 μm. With this, it is possible to provide the probe pin 100 capable of coping with high-frequency characteristics.

Referring to FIG. 11, the probe pin 100 of the vertical probe card according to the exemplary embodiment of the present disclosure includes a fine trench 88 provided in the side surface thereof. A plurality of fine trenches 88 are formed in the side surface of the probe pin 100 in a corrugated shape in which peaks and valleys with a depth in the range of 20 nm to 1 μm are repeated along the side surface of the probe pin 100 in a direction orthogonal to the thickness direction of the probe pin 100.

In the side surface of the probe pin 100, the fine trenches 88 are formed to extend in the thickness direction of the probe pin 100. In other words, the extending direction of the peaks and valleys of the fine trenches 88 corresponds to the thickness direction of the probe pin 100. Here, the thickness direction of the probe pin 100 means a direction in which a metal filling material grows during electroplating.

In a side surface of the plates constituting the probe pin 100, the fine trenches 88 are formed in a corrugated shape in which peaks and valleys are repeated in a direction orthogonal to the thickness direction of the plates.

The fine trenches 88 have a depth in the range of 20 nm to 1 μm and a width in the range of 20 nm to 1 μm. Here, because the fine trenches 88 are resulted from the formation of the pores formed during the manufacture of the mold M made of the anodic aluminum oxide film, the width and depth of the fine trenches 88 are less than the diameter of the pores formed in the mold M. On the other hand, in the process of forming the inner space IH in the mold M, portions of the pores of the mold M may be crushed by an etching solution to at least partially form a fine trench 88 having a depth greater than the diameter of the pores formed during the anodization.

Since the mold M made of the anodic aluminum oxide film includes a large number of pores, and at least a portion of the mold M is etched to form the inner space IH, and the metal filling material is formed in the inner space IH, the fine trenches 88 are provided in the side surface of the probe pin 100 as a result of contact between the probe pin 100 and the pores of the mold M.

Since the fine trenches 88 have a corrugated shape in which peaks and valleys with a depth in the range of 20 nm to 1 μm are repeated in a direction orthogonal to the thickness direction, they have an effect of increasing the surface area of the side surface of the probe pin 100. With the configuration of the fine trenches 88 formed in the side surface of the probe pin 100, the surface area through which a current flows can be increased by a skin effect, so that the density of the current flowing along the probe pin 100 can be increased, thereby improving electrical characteristics (particularly, high-frequency characteristics) of the probe pin 100. In addition, with the configuration of the fine trenches 88, heat generated in the probe pin 100 can be rapidly dissipated, thereby suppressing a rise in the temperature of the probe pin 100.

FIGS. 12 and 13 are views illustrating a comparison between the vertical probe card according to the exemplary embodiment of the present disclosure and the vertical probe card according to the related art. FIG. 12 is a view illustrating a state before overdrive. FIG. 13 is a view illustrating a state after overdrive.

The left side of FIGS. 12 and 13 illustrates the vertical probe card according to the related art in which a straight pin or a cobra pin 7 is adopted, and the right side of FIGS. 12 and 13 illustrates the vertical probe card according to the exemplary embodiment of the present disclosure.

Referring to FIG. 12, the lateral width and the thickness of the probe pin 100 of the vertical probe card according to the exemplary embodiment of the present disclosure are equal to those of the straight pin or the cobra pin 7 of the vertical probe card according to the related art. Thus, the vertical probe card according to the exemplary embodiment of the present disclosure can be implemented as a vertical probe card capable of coping with a narrower pitch.

Referring to FIG. 13, the behavioral characteristics of the probe pin 7 of the vertical probe card according to the related art are different from those of the probe pin 100 of the vertical probe card according to the exemplary embodiment of the present disclosure. The probe pin 7 of the vertical probe card according to the related art has a structure in which a body thereof is elastically bent or curved in a convex shape in the horizontal direction by pressure applied to opposite ends thereof to thereby buffer the pressure. On the contrary, the probe pin 100 of the vertical probe card according to the exemplary embodiment of the present disclosure has a structure in which the probe pin 100 maintains a substantial vertical state even when pressure is applied to opposite ends thereof and the elastic portion 130 of the probe pin 100 is compressed along the length direction of the probe pin 100 to thereby buffer the pressure.

Due to the different behavioral characteristics, in the case of the vertical probe card according to the related art, when the overall length of the probe pin 7 is shortened, a problem occurs in that a semiconductor chip is damaged by an excessive pressing force. Thus, it is difficult to shorten the overall length of the probe pin 7, which is disadvantageous in testing high-frequency characteristics of the semiconductor chip. On the contrary, according to the exemplary embodiment of the present disclosure, even when the overall length of the probe pin 100 is shortened, it is possible to prevent an excessive pressing force from being generated on the semiconductor chip by adjusting the actual width t and the thickness of the plates constituting the elastic portion 130. Therefore, the vertical probe card according to the exemplary embodiment of the present disclosure is advantageous in testing high-frequency characteristics of the semiconductor chip.

In addition, in the case of the vertical probe card according to the related art, since the probe pin 7 is deformed to be curved in the horizontal direction, a short-circuit problem occurs when a plurality of probe pins 7 are arranged at a narrower pitch. Therefore, there is a limit in arranging the probe pins 7 at a narrower pitch. On the contrary, according to the present disclosure, since the elastic portion 130 provided inside the support portion 140 is compressed in the length direction of the probe pin 100 while the support pin 140 maintains a vertical state, a short-circuit problem does not occur even when the probe pins 100 are arranged at a narrower pitch. Therefore, it is possible to test semiconductor chips with a narrower pitch compared to the vertical probe card according to the related art.

As described above, the present disclosure has been described with reference to the exemplary embodiment. However, those skilled in the art will appreciate that various modifications, additions, and substitutions are possible, without departing from the scope and spirit of the disclosure as disclosed in the accompanying claims.

The invention claimed is:

1. A vertical probe card that is used in a test process of testing a chip manufactured on a wafer during a semiconductor manufacturing process and is capable of coping with a narrower pitch, the vertical probe card comprising:
   a space transformer having a connection pad;
   a guide plate provided under the space transformer so as to be spaced apart from the space transformer; and
   a probe pin inserted and installed into a hole of the guide plate,
   wherein the probe pin comprises:
   a first plunger located at an upper portion thereof and configured to be connected to the connection pad of the space transformer;
   a second plunger located at a lower portion thereof and configured to be connected to the chip; and
   an elastic portion configured to elastically displace the first plunger and the second plunger in a length direction of the probe pin,
   wherein the elastic portion has a uniform cross-sectional shape in a thickness direction of the probe pin, and
   the elastic portion has a uniform thickness in a width direction and the length direction of the probe pin,
   wherein the elastic portion is formed by repeatedly bending a plate, and an actual width of the plate and a thickness of the plate have a ratio in a range of 1:5 to 1:30.

2. The vertical probe card of claim 1, wherein a support portion configured to guide the elastic portion to be compressed and extended in the length direction of the probe pin and configured to prevent the elastic portion from being buckled when compressed is provided outside the elastic portion along the length direction of the probe pin.

3. The vertical probe card of claim 2, wherein the second plunger moves vertically upward inside the support portion and performs a wiping operation at a second contact point.

4. The vertical probe card of claim 2, wherein during an overdrive process in which the probe pin tests the chip, the support portion maintains a vertical state, and the second plunger performs a wiping operation on the chip as the second plunger is tilted while maintaining a contact pressure with the chip.

5. The vertical probe card of claim 2, wherein as the first plunger is vertically moved downward inside the support portion, an additional contact point is formed between the first plunger and the support portion.

6. The vertical probe card of claim 2, wherein the elastic portion comprises:
   a first elastic portion connected to the first plunger;
   a second elastic portion connected to the second plunger; and
   an intermediate fixing portion provided between the first elastic portion and the second elastic portion and provided integrally with the support portion.

7. The vertical probe card of claim 6, wherein before the probe pin tests the chip, the first plunger is in a state in contact with the connection pad so that the first elastic portion is compressively deformed in the length direction of the probe pin, and the second plunger is in a state not in contact with the chip, and
   when the probe pin tests the chip, the second plunger is brought into contact with the chip so that the second elastic portion is compressively deformed.

8. The vertical probe card of claim 1, wherein the vertical probe card tests a non-memory semiconductor chip.

9. The vertical probe card of claim 1, wherein a pitch between adjacent probe pins is in a range of 50 μm to 160 μm.

10. The vertical probe card of claim 1, wherein a lateral width of the probe pin is in a range of 40 μm to 200 μm, and
   a thickness of the probe pin is in a range of 40 μm to 200 μm.

11. A vertical probe card that is used in a test process of testing a chip manufactured on a wafer during a semiconductor manufacturing process and is capable of coping with a narrower pitch, the vertical probe card comprising:
   a space transformer having a connection pad;
   a guide plate provided under the space transformer so as to be spaced apart from the space transformer; and
   a probe pin inserted and installed into a hole of the guide plate,
   wherein the probe pin comprises:
   a first plunger located at an upper portion thereof and configured to be connected to the connection pad of the space transformer;
   a second plunger located at a lower portion thereof and configured to be connected to the chip; and
   an elastic portion configured to elastically displace the first plunger and the second plunger in a length direction of the probe pin,
   wherein the elastic portion has a uniform cross-sectional shape in a thickness direction of the probe pin, and
   the elastic portion has a uniform thickness in a width direction and the length direction of the probe pin,
   wherein a plurality of fine trenches are formed in a side surface of the probe pin in a corrugated shape in which peaks and valleys with a depth in a range of 20 nm to 1 μm are repeated along the side surface of the probe pin in a direction orthogonal to the thickness direction of the probe pin.

* * * * *